(12) United States Patent
Atsumi et al.

(10) Patent No.: US 10,935,836 B2
(45) Date of Patent: Mar. 2, 2021

(54) ORGANIC ELECTROLUMINESCENT DISPLAY DEVICE, PHASE DIFFERENCE FILM, AND CIRCULARLY POLARIZING PLATE

(71) Applicant: FUJIFILM Corporation, Tokyo (JP)

(72) Inventors: Kunihiro Atsumi, Kanagawa (JP); Yukito Saitoh, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/529,168

(22) Filed: Aug. 1, 2019

(65) Prior Publication Data
US 2019/0353957 A1    Nov. 21, 2019

Related U.S. Application Data

(63) Continuation of application No. PCT/JP2018/008590, filed on Mar. 6, 2018.

(30) Foreign Application Priority Data

Mar. 8, 2017  (JP) .............................. JP2017-044014
Dec. 8, 2017  (JP) .............................. JP2017-236237

(51) Int. Cl.
| | | |
|---|---|---|
| G02F 1/1335 | (2006.01) | |
| B32B 7/02 | (2019.01) | |
| G02B 5/30 | (2006.01) | |
| G02F 1/13363 | (2006.01) | |
| G09F 9/30 | (2006.01) | |
| H01L 27/32 | (2006.01) | |

(Continued)

(52) U.S. Cl.
CPC .......... G02F 1/133528 (2013.01); B32B 7/02 (2013.01); G02B 5/3016 (2013.01);
(Continued)

(58) Field of Classification Search
None
See application file for complete search history.

(56) References Cited

U.S. PATENT DOCUMENTS

| | | |
|---|---|---|
| 2014/0375935 A1 | 12/2014 | Yamada et al. |
| 2017/0192145 A1 | 7/2017 | Furuki et al. |

(Continued)

FOREIGN PATENT DOCUMENTS

| | | | |
|---|---|---|---|
| JP | 2006-126770 A | 5/2006 | |
| JP | 2007-188033 A | 7/2007 | |

(Continued)

OTHER PUBLICATIONS

International Search Report issued in PCT/JP2018/008590 dated Jun. 5, 2018.

(Continued)

*Primary Examiner* — Vip Patel
(74) *Attorney, Agent, or Firm* — Edwards Neils LLC; Jean C. Edwards, Esq.

(57) ABSTRACT

The present invention provides an organic electroluminescent display device that further suppresses reflection of external light and a change in tint in a case of being viewed in an oblique direction, a phase difference film, and a circularly polarizing plate. This organic electroluminescent display device has an organic electroluminescent display panel and a circularly polarizing plate. The circularly polarizing plate has a polarizer and a phase difference film. The phase difference film has, from the polarizer side, a positive A-plate, a first positive C-plate, and a λ/4 plate. The positive A-plate and the first positive C-plate have predetermined optical properties. The in-plane slow axis of the positive A-plate and the absorption axis of the polarizer are orthogonal to each other. The angle formed between the in-plane slow axis of the positive A-plate and the in-plane slow axis of the λ/4 A plate is 45°±10°.

20 Claims, 4 Drawing Sheets

(51) Int. Cl.
*H01L 51/52* (2006.01)
*H05B 33/02* (2006.01)

(52) U.S. Cl.
CPC ..... *G02B 5/3025* (2013.01); *G02F 1/133634* (2013.01); *G09F 9/30* (2013.01); *H01L 27/32* (2013.01); *H01L 51/5281* (2013.01); *H05B 33/02* (2013.01); *G02F 2001/133531* (2013.01); *G02F 2001/133541* (2013.01); *G02F 2001/133638* (2013.01)

(56) References Cited

U.S. PATENT DOCUMENTS

2017/0343713 A1    11/2017    Lee et al.
2018/0159085 A1    6/2018     Yoshida

FOREIGN PATENT DOCUMENTS

| | | |
|---|---|---|
| JP | 2008-209651 A | 9/2008 |
| JP | 2015-014712 A | 1/2015 |
| JP | 2016-051083 A | 4/2016 |
| KR | 10-2011-0066255 A | 6/2011 |
| WO | 2013/137464 A1 | 9/2013 |
| WO | 2016/052360 A1 | 4/2016 |
| WO | 2016/194801 A1 | 12/2016 |

OTHER PUBLICATIONS

Written Opinion issued in PCT/JP2018/008590 dated Jun. 5, 2018.
International Preliminary Report on Patentability completed by WIPO dated Sep. 10, 2019 in connection with International Patent Application No. PCT/JP2018/008590.

US 10,935,836 B2

ORGANIC ELECTROLUMINESCENT DISPLAY DEVICE, PHASE DIFFERENCE FILM, AND CIRCULARLY POLARIZING PLATE

CROSS-REFERENCE TO RELATED APPLICATIONS

This application is a Continuation of PCT International Application No. PCT/JP2018/008590 filed on Mar. 6, 2018, which was published under PCT Article 21(2) in Japanese, and which claims priority under 35 U.S.C. § 119(a) to Japanese Patent Application No. 2017-044014 filed on Mar. 8, 2017 and Japanese Patent Application No. 2017-236237 filed on Dec. 8, 2017. The above applications are hereby expressly incorporated by reference, in their entirety, into the present application.

BACKGROUND OF THE INVENTION

1. Field of the Invention

The present invention relates to an organic electroluminescent display device, a phase difference film, and a circularly polarizing plate.

2. Description of the Related Art

Conventionally, in order to suppress adverse effects of reflection of external light, a circularly polarizing plate has been used in an organic electroluminescent (EL) display device or the like. As a circularly polarizing plate, for example, as described in WO2013/137464A, an aspect in which a phase difference plate (so-called broadband λ/4 plate) constituted of a λ/2 plate and a λ/4 plate, and a polarizer are combined is disclosed.

SUMMARY OF THE INVENTION

On the other hand, in recent years, in a display device typified by an organic EL display device, further improvement in viewing angle characteristics has been required. More specifically, in a display device including a circularly polarizing plate, it is required to further reduce reflection of external light in the case of being viewed in an oblique direction.

The present inventors have examined the external light reflection characteristics of the organic EL display device including the circularly polarizing plate described WO2013/137464A and found that the suppression of the reflection of external light in the case of being viewed in an oblique direction does not reach the recently required level and further improvement is required.

In addition, when the display device is viewed in an oblique direction, it is also required that a change in tint is small in the case where the display device is viewed while changing the azimuthal angle. That is, it is required that a change in tint in the case of being viewed in the oblique direction is further suppressed.

The present invention is made in consideration of the above circumstances and an object thereof is to provide an organic electroluminescent display device that further suppresses reflection of external light and a change in tint in a case of being viewed in an oblique direction.

Another object of the present invention is to provide a phase difference film and a circularly polarizing plate that in the case where the phase difference film and the circularly polarizing plate are applied to a display device, further suppress reflection of external light and a change in tint in a case of being viewed in an oblique direction.

As a result of intensive investigations on problems in the related art, the present inventors have found that the above problems can be solved by using a circularly polarizing plate having a predetermined configuration.

That is, the present inventors have found that the above objects can be achieved by adopting the following configurations.

(1) An organic electroluminescent display device comprising: an organic electroluminescent display panel; and a circularly polarizing plate arranged on the organic electroluminescent display panel, in which the circularly polarizing plate has a polarizer and a phase difference film, the phase difference film has, from a polarizer side, a positive A-plate, a first positive C-plate, and a λ/4 plate, an in-plane retardation of the positive A-plate at a wavelength of 550 nm is 80 to 120 nm, a retardation of the first positive C-plate in a thickness direction at a wavelength of 550 nm is −110 to −70 nm, an in-plane slow axis of the positive A-plate and an absorption axis of the polarizer are orthogonal to each other, and an angle formed between the in-plane slow axis of the positive A-plate and an in-plane slow axis of the λ/4 plate is 45°±10°.

(2) The organic electroluminescent display device according to (1), in which the phase difference film further has a second positive C-plate on a side of the λ/4 plate opposite to the first positive C-plate, and a retardation of the second positive C-plate in a thickness direction at a wavelength of 550 nm is −100 to −50 nm.

(3) The organic electroluminescent display device according to (1), in which an Nz factor of the λ/4 plate is 0.30 to 0.70.

(4) The organic electroluminescent display device according to any one of (1) to (3), in which the in-plane retardation of the positive A-plate at a wavelength of 550 nm is 90 to 110 nm.

(5) The organic electroluminescent display device according to any one of (1) to (4), in which the retardation of the first positive C-plate in the thickness direction at a wavelength of 550 nm is −100 to −75 nm.

(6) The organic electroluminescent display device according to any one of (1) to (5), in which at least one of the positive A-plate, the first positive C-plate, or the λ/4 plate exhibits reverse wavelength dispersibility.

(7) The organic electroluminescent display device according to any one of (1) to (6), in which all of the positive A-plate, the first positive C-plate, and the λ/4 plate exhibit reverse wavelength dispersibility.

(8) The organic electroluminescent display device according to any one of (1) to (7), in which all of the positive A-plate, the first positive C-plate, and the λ/4 plate are layers formed by using a liquid crystal compound.

(9) A phase difference film comprising, in order: a positive A-plate; a first positive C-plate; a λ/4 plate; and a second positive C-plate, in which an in-plane retardation of the positive A-plate at a wavelength of 550 nm is 80 to 120 nm, a retardation of the first positive C-plate in a thickness direction at a wavelength of 550 nm is −110 to −70 nm, a retardation of the second positive C-plate in a thickness direction at a wavelength of 550 nm is −100 to −50 nm, and an angle formed between an in-plane slow axis of the positive A-plate and an in-plane slow axis of the λ/4 plate is 45°±10°.

(10) The phase difference film according to (9), in which the in-plane retardation of the positive A-plate at a wavelength of 550 nm is 90 to 110 nm.

(11) The phase difference film according to (9) or (10), in which the retardation of the first positive C-plate in the thickness direction at a wavelength of 550 nm is −100 to −75 nm.

(12) The phase difference film according to any one of (9) to (11), in which all of the positive. A-plate, the first positive C-plate, the λ/4 plate, and the second positive C-plate exhibit reverse wavelength dispersibility.

(13) The phase difference film according to any one of (9) to (12), in which all of the positive A-plate, the first positive C-plate, the λ/4 plate, and the second positive C-plate are layers formed by using a liquid crystal compound.

(14) A circularly polarizing plate comprising: a polarizer; and the phase difference film according to any one of (9) to (13) arranged on the polarizer, in which, from a polarizer side, the positive A-plate, the first positive C-plate, the λ/4 plate, and the second positive C-plate are arranged in this order, and an in-plane slow axis of the positive A-plate and an absorption axis of the polarizer are orthogonal to each other.

(15) A phase difference film comprising, in order: a positive A-plate; a first positive C-plate; and a λ/4 plate, in which an in-plane retardation of the positive A-plate at a wavelength of 550 nm is 80 to 120 nm, a retardation of the first positive C-plate in a thickness direction at a wavelength of 550 nm is −110 to −70 nm, an Nz factor of the λ/4 plate is 0.30 to 0.70, and an angle formed between an in-plane slow axis of the positive A-plate and an in-plane slow axis of the λ/4 plate is 45°±10°.

(16) The phase difference film according to (15), in which the in-plane retardation of the positive A-plate at a wavelength of 550 nm is 90 to 110 nm.

(17) The phase difference film according to (15) or (16), in which the retardation of the first positive C-plate in a thickness direction at a wavelength of 550 nm is −100 to −75 nm.

(18) The phase difference film according to any one of (15) to (17), in which all of the positive A-plate, the first positive C-plate, and the λ/4 plate exhibit reverse wavelength dispersibility.

(19) The phase difference film according to any one of (15) to (18), in which all of the positive A-plate, the first positive C-plate, and the λ/4 plate are layers formed by using a liquid crystal compound.

(20) A circularly polarizing plate comprising: a polarizer; and the phase difference film according to any one of (15) to (19) arranged on the polarizer, in which, from a polarizer side, the positive A-plate, the first positive C-plate, the λ/4 plate, and the second positive C-plate are arranged in this order, and an in-plane slow axis of the positive A-plate and an absorption axis of the polarizer are orthogonal to each other.

(21) An organic electroluminescent display device according to (2), in which the thickness of each of the positive A-plate, the first positive C-plate, the λ/4 plate, and the second positive C-plate is 6 μm or less.

According to the present invention, it is possible to provide an organic electroluminescent display device that further suppresses reflection of external light and a change in tint in a case of being viewed in an oblique direction.

According to the present invention, it is also possible to provide a phase difference film and a circularly polarizing plate that in the case where the phase difference film and the circularly polarizing plate are applied to a display device, further suppress reflection of external light and a change in tint in a case of being viewed in an oblique direction.

DESCRIPTION OF THE PREFERRED EMBODIMENTS

Figure 1:
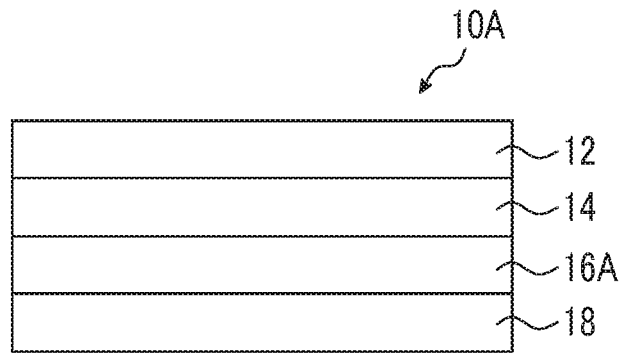
FIG. 1 is a cross-sectional view showing a first embodiment of a phase difference film according to the present invention.

Hereinafter, the present invention will be described in detail. In the present specification, the numerical value range expressed by the term "to" means that the numerical values described before and after "to" are included as a lower limit and an upper limit, respectively. First, the terms used in the present specification will be described.

In the present invention, $Re(\lambda)$ and $Rth(\lambda)$ respectively represent an in-plane retardation and a retardation in a thickness direction at a wavelength $\lambda$. Unless otherwise specified, the wavelength $\lambda$ is 550 nm.

In the present invention, $Re(\lambda)$ and $Rth(\lambda)$ are values measured at wavelength $\lambda$ in AxoScan OPMF-1 (manufactured by Opto Science, Inc.). By inputting the average refractive index $((nx+ny+nz)/3)$ and the film thickness (d (μm)) to AxoScan, the following expressions can be calculated.

Slow axis direction (°)

$Re(\lambda) = R0(\lambda)$ $Rth(\lambda) = (nx+ny)/2 - nz) \times d$

R0(λ) is expressed as a numerical value calculated by AxoScan OPMF-1 but means Re(λ).

In the present specification, the refractive indices nx, ny, and nz are measured using an Abbe refractometer (NAR-4T, manufactured by Atago Co., Ltd.), and a sodium lamp (λ=589 nm) is used as a light source. In addition, in the case where the wavelength dependence is measured, the wavelength dependence can be measured using a combination of a multi-wavelength Abbe refractometer DR-M2 (manufactured by Atago Co., Ltd.) and an interference filter.

In addition, as the refractive index, values described in "Polymer Handbook" (John Wiley&Sons, Inc.) and catalogs of various optical films can also be used. The values of average refractive index of major optical films are as follows: cellulose acylate (1.48), cycloolefin polymer (1.52), polycarbonate (1.59), polymethyl methacrylate (1.49), and polystyrene (1.59).

In the present specification, the Nz factor is a value obtained from Nz=(nx−nz)/(nx−ny).

In the present specification, the term "visible light" refers to light in a wavelength range of 380 to 800 nm.

In the present specification, an angle (for example, an angle of "90°" or the like) and an angular relationship (for example, "orthogonal", "parallel", and "crossing at 45°") include the margin of allowable error in the technical field to which the present invention belongs. For example, the allowable error means that the margin of the error is within a precise angle ±10°. A difference between an actual angle and the precise angle is preferably 5° or less and more preferably 3° or less.

In the present specification, the definition of A-plate is as follows.

There are two kinds of A-plates: a positive A-plate and a negative A-plate, and when the refractive index in the slow axis direction (the direction in which the refractive index in the plane is maximum) in the film plane is nx, the refractive index orthogonal to the in-plane slow axis in the plane is ny, and the refractive index in the thickness direction is nz, the positive A-plate satisfies the relationship of Expression (A1), and the negative A-plate satisfies the relationship of Expression (A2). The positive A-plate has a positive Rth value and the negative A-plate has a negative Rth value.

$nx > ny \cong nz$  Expression (A1)

$ny < nx \cong nz$  Expression (A2)

The expression "≅" includes not only a case in which both are completely the same but also a case in which both are substantially the same. Regarding the expression "substantially the same", for example, "ny≅nz" includes a case in which (ny−nz)×d (wherein d represents a film thickness) is −10 to 10 nm and preferably −5 to 5 nm, and "nx≅nz" includes a case in which (nx−nz)×d is −10 to 10 nm and preferably −5 to 5 nm.

There are two kinds of C-plates: a positive C-plate and a negative C-plate. The positive C-plate satisfies the relationship of Expression (C1), and the negative C-plate satisfies the relationship of Expression (C2). Rth of the positive C-plate shows a negative value and Rth of the negative C-plate shows a positive value.

$nz > nx \cong ny$  Expression (C1)

$nz < nx \cong ny$  Expression (C2)

The expression "≅" includes not only a case in which both are completely the same but also a case in which both are substantially the same. Regarding the expression "substantially the same", for example, "nx≅ny" includes a case in which (nx−ny)×d (wherein d represents a film thickness) is 0 to 10 nm, and preferably 0 to 5 nm.

In the present specification, an "absorption axis" of a polarizer means a direction in which absorbance is maximized. A "transmission axis" means a direction in which an angle with respect to the "absorption axis" is 90°.

In the present specification, an "in-plane slow axis" of each of a negative A-plate and a positive A-plate means a direction in which a refractive index in a plane is maximized.

Hereinafter, an organic electroluminescent display device (organic EL display device), a phase difference film, and a circularly polarizing plate according to embodiments of the present invention will be described with drawings.

In the following, the phase difference film, the circularly polarizing plate, and the organic EL display device will be described in this order.

First Embodiment

Phase Difference Film

A first embodiment of a phase difference film according to the present invention will be described with the drawings. FIG. 1 is a cross-sectional view showing a first embodiment of a phase difference film according to the present invention. The drawing in the present invention is a schematic view and the relationship and positional relationship between the thicknesses of the layers do not necessarily coincide with the actual ones.

A phase difference film 10A has a positive A-plate 12, a first positive C-plate 14, a λ/4 plate 16A, and a second positive C-plate 18 in this order.

Figure 2:
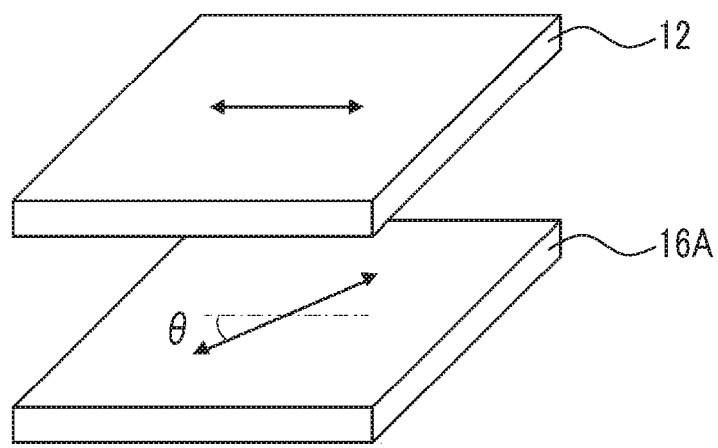
FIG. 2 is a view showing a relationship between an in-plane slow axis of a positive A-plate and an in-plane slow axis of a λ/4 plate in the first embodiment of the phase difference film according to the present invention.

In addition, in FIG. 2, the relationship between an in-plane slow axis of the positive A-plate 12 and an in-plane slow axis of the λ/4 plate 16A is shown. In FIG. 2, the arrows in the positive A-plate 12 and the λ/4 plate 16A represent the direction of the in-plane slow axis in the respective layers.

Hereinafter, each member included in the phase difference film 10A will be described in detail.

(Positive A-Plate)

The positive A-plate is a layer arranged on a side closest to the polarizer in the circularly polarizing plate described later. The positive A-plate preferably has a single structure.

The in-plane retardation of the positive A-plate at a wavelength of 550 nm is 80 to 120 nm and preferably 90 to 110 nm from the viewpoint of further suppressing reflection of external light and/or a change in tint in the case where an organic EL display device is viewed in an oblique direction device (hereinafter, simply referred to as "from the viewpoint that the effect of the present invention is more excellent).

The Rth(550) of the positive A-plate, which is a retardation in a thickness direction at a wavelength of 550 nm, is preferably 40 to 60 nm and more preferably 45 to 55 nm from the viewpoint that the effect of the present invention is more excellent.

The positive A-plate may exhibit forward wavelength dispersibility or reverse wavelength dispersibility. However, from the viewpoint that the effect of the present invention is more excellent, the positive A-plate preferably exhibits reverse wavelength dispersibility. The forward wavelength dispersibility and the reverse wavelength dispersibility are preferably exhibited in the visible light range.

The positive A-plate exhibiting forward wavelength dispersibility means that the in-plane retardation of the positive A-plate exhibits forward wavelength dispersibility. That is, this means that as the measurement wavelength increases, the in-plane retardation of the positive A-plate decreases.

In addition, the positive A-plate exhibiting reverse wavelength dispersibility means that the in-plane retardation of the positive A-plate exhibits reverse wavelength dispersibility. That is, as the measurement wavelength increases, the in-plane retardation of the positive A-plate increases.

In order to set the in-plane retardation of the positive A-plate to appropriately exhibit reverse wavelength dispersibility, specifically, the Re(450)/Re(550) of the positive A-plate is preferably 0.70 or more and less than 1.00 and more preferably 0.80 to 0.90, and the Re(650)/Re(550) of the positive A-plate is preferably more than 1.00 and 120 or less and more preferably 1.02 to 1.10.

The Re(450) and the Re(650) represent in-plane retardations of the positive A-plate measured at wavelengths of 450 nm and 650 nm, respectively.

The thickness of the positive A-plate is not particularly limited and is adjusted such that the in-plane retardation is in a predetermined range. From the viewpoint of reducing the thickness of the phase difference film, the thickness is preferably 6.0 μm or less, more preferably 0.5 to 5.0 μm, and even more preferably 0.5 to 2.0 μm.

In the present specification, the thickness of the positive A-plate means the average thickness of the positive A-plate. The average thickness is obtained by measuring the thickness at 5 or more random points in the positive A-plate and arithmetically averaging those values.

It is preferable that the positive A-plate is a layer formed by using a liquid crystal compound. However, as long as predetermined characteristics such as the above-mentioned in-plane retardation are satisfied, the positive A-plate may be constituted of another material. For example, the positive A-plate may be formed by using a polymer film (particularly, a polymer film subjected to a stretching treatment).

Conventionally, a rigid flat type display panel has been mainly used as an organic electroluminescent display panel (organic EL display panel). However, in recent years, a foldable flexible organic EL display panel has been proposed. For a circularly polarizing plate used for such a flexible organic EL display panel, it is required that the circularly polarizing plate itself is excellent in flexibility. From this viewpoint, since the positive A-plate formed by using a liquid crystal compound is more flexible than a polymer film, the circularly polarizing plate can be suitably applied to a flexible organic EL display panel.

In addition, for the above reason, it is preferable that the first positive C-plate, the λ/4 plate, and the second positive C-plate described in detail later are formed by using a liquid crystal compound.

That is, as long as the circularly polarizing plate includes a positive A-plate formed by using a liquid crystal compound, a first positive C-plate formed by using a liquid crystal compound, a λ/4 plate formed by using a liquid crystal compound, and a second positive C-plate formed by using a liquid crystal compound, the circularly polarizing plate can be more suitably applied to a flexible organic EL display panel.

The kind of liquid crystal compound is not particularly limited but, liquid crystal compounds can be classified into a rod-like type (rod-like liquid crystal compound) and a disk-like type (disk-like liquid crystal compound, discotic liquid crystal compound) based on the shape thereof. Further, each kind includes a low molecular type and a high molecular type. A high molecule generally indicates a molecule having a polymerization degree of 100 or more (Masao Doi; Polymer Physics-Phase Transition Dynamics, 1992, IWANAMI SHOTEN, PUBLISHERS, page 2). A mixture of two or more kinds of rod-like liquid crystal compounds, two or more kinds of disk-like liquid crystal compounds, or a rod-like liquid crystal compound and a disk-like liquid crystal compound may be used.

Since changes in temperature and humidity in optical properties can be made small, it is more preferable to form the positive A-plate using a liquid crystal compound (rod-like liquid crystal compound or disk-like liquid crystal compound) having a polymerizable group. The liquid crystal compound may be a mixed compound of two or more kinds. In this case, it is preferable that at least one has two or more polymerizable groups.

That is, it is preferable that the positive A-plate is a layer formed by fixing a liquid crystal compound (rod-like liquid crystal compound or disk-like liquid crystal compound) having a polymerizable group through polymerization or the like. In this case, after the layer is formed, the liquid crystal compound does not need to exhibit liquid crystallinity any longer.

The kind of the polymerizable group is not particularly limited and a polymerizable group capable of causing radical polymerization or cationic polymerization is preferable.

A known radically polymerizable group can be used as a radically polymerizable group, and an acryloyl group or a methacryloyl group is preferable.

As a cationically polymerizable group, a known cationically polymerizable group can be used, and specific examples thereof include an alicyclic ether group, a cyclic acetal group, a cyclic lactone group, a cyclic thioether group, a spiro ortho ester group, and a vinyloxy group. Among these, an alicyclic ether group or a vinyloxy group is preferable, and an epoxy group, an oxetanyl group, or a vinyloxy group is more preferable.

Examples of particularly preferable polymerizable groups include the following.

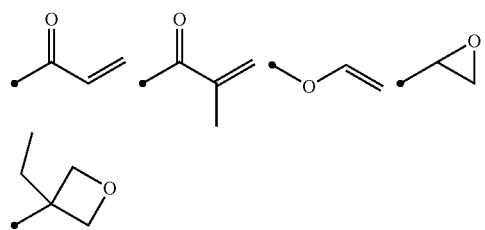

Among these, as the liquid crystal compound having a polymerizable group used in forming the positive A-plate, a compound represented by Formula (I) is preferable.

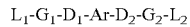

$D_1$ and $D_2$ each independently represent —CO—O—, —O—CO—, —C(=S)O—, —O—C(=S)—, —$CR^1R^2$—, —$CR^1R^2$—$CR^3R^4$—, —O—$CR^1R^2$—, —$CR^1R^2$—O—, —$CR^1R^2$—O—$CR^3R^4$—, —$CR^1R^2$—O—CO—, —CO—O—$CR^1R^2$—, —$CR^1R^2$—O—CO—$CR^3R^4$—, —$CR^1R^2$—CO—O—$CR^3R^4$—, —$CR^1R^2$—$NR^3$—, —CO—$NR^1$—, or —$NR^1$—CO—, and $R^1$, $R^2$, $R^3$, and $R^4$ each independently represent a hydrogen atom, a halogen atom, or an alkyl group having 1 to 4 carbon atoms.

$G_1$ and $G_2$ each independently represent a divalent alicyclic hydrocarbon group having 5 to 8 carbon atoms, a methylene group contained in the alicyclic hydrocarbon group may be substituted by —O—, —S—, or —NR$^6$—, and R$^6$ represents a hydrogen atom or an alkyl group having 1 to 6 carbon atoms.

$L_1$ and $L_2$ each independently represent a monovalent organic group, and at least one selected from the group consisting of $L_1$ and $L_2$ represents a monovalent group having a polymerizable group.

Ar represents a divalent aromatic ring group e ted by Formula (II-1), (II-2), (II-3), or (II-4).

Formula

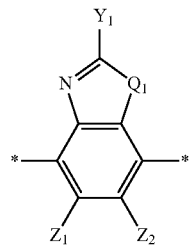

(II-1)

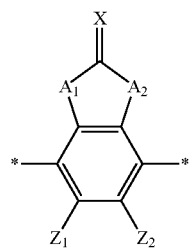

(II-2)

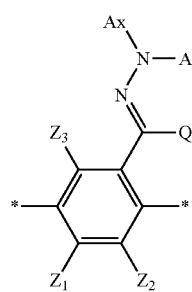

(II-3)

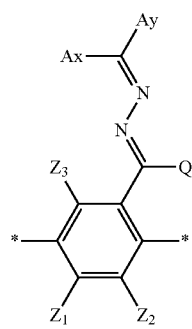

(II-4)

$Q_1$ represents —S—, —O—, or —NR$^{11}$—, and R$^{11}$ represents a hydrogen atom or an alkyl group having 1 to 6 carbon atoms. $Y_1$ represents an aromatic hydrocarbon group having 6 to 12 carbon atoms or an aromatic heterocyclic group having 3 to 12 carbon atoms. $Z_1$, $Z_2$, and $Z_3$ each independently represent a hydrogen atom, an aliphatic hydrocarbon group having 1 to 20 carbon atoms, an alicyclic hydrocarbon group having 3 to 20 carbon atoms, a monovalent aromatic hydrocarbon group having 6 to 20 carbon atoms, a halogen atom, a cyano group, a nitro group, —NR$^{12}$R$^{13}$, or —SR$^{12}$. $Z_1$ and $Z_2$ may be bonded to each other to form an aromatic hydrocarbon ring or an aromatic heterocyclic ring, and R$^{12}$ and R$^{13}$ each independently represent a hydrogen atom or an alkyl group having 1 to 6 carbon atoms. $A_1$ and $A_2$ each independently represent a group selected from the group consisting of —O—, —NR$^{21}$—(R$^{21}$ represents a hydrogen atom or a substituent), —S—, and —CO—. X represents a non-metal atom of Groups XIV to XVI to which a hydrogen atom or a substituent may be bonded. Ax represents an organic group having 2 to 30 carbon atoms and having at least one aromatic ring selected from the group consisting of an aromatic hydrocarbon ring and an aromatic heterocyclic ring. Ay represents a hydrogen atom, an alkyl group having 1 to 6 carbon atoms which may have a substituent, or an organic group having 2 to 30 carbon atoms and having at least one aromatic ring selected from the group consisting of an aromatic hydrocarbon ring and an aromatic heterocyclic ring. The aromatic ring in Ax and Ay may have a substituent, and Ax and Ay may be bonded to each other to form a ring. $Q_2$ represents a hydrogen atom or an alkyl group having 1 to 6 carbon atoms which may have a substituent.

As for definitions and preferable ranges of the individual substituents of the compound represented by Formula (I), $D_1$, $D_2$, $G_1$, $G_2$, $L_1$, $L_2$, R$^1$, R$^2$, R$^3$, R$^4$, $Z_1$, and $Z_2$ of Formula (I) can be referred respectively to the description on D$^1$, D$^2$, G$^2$, L$^1$, L$^2$, R$^4$, R$^5$, R$^6$, R$^7$, X$^1$, Y$^1$, Q$^1$, and Q$^2$ of Compound (A) in JP2012-021068A, $A_1$, $A_2$, and X of Formula (I) can be respectively referred to the description on $A_1$, $A_2$, and X of the compound represented by Formula (I) in JP2008-107767A, and Ax, Ay, and $Q_2$ of Formula (I) can be respectively referred to the description on Ax, Ay, and Q$^1$ of the compound represented by Formula (I) in WO2013/018526A. $Z_3$ can be referred to the description on Q$^1$ of Compound (A) in JP2012-021068A.

One of $L_1$ and $L_2$ is preferably a group represented by -$D_3$-$G_3$-Sp-$P_3$. In addition, both $L_1$ and $L_2$ may be groups represented by -$D_3$-$G_3$-Sp-$P_3$.

$D_3$ has the same definition as $D_1$.

$G_3$ represents a single bond, a divalent aromatic ring group or heterocyclic group having 6 to 12 carbon atoms, or a divalent alicyclic hydrocarbon group having 5 to 8 carbon atoms, and the methylene group included in the alicyclic hydrocarbon group may be substituted by —O—, —S—, or —NR$^7$—, where R$^7$ represents a hydrogen atom or an alkyl group having 1 to 6 carbon atoms.

Sp represents a single bond, an alkylene group, —O—, —C(=O)—, —NR$^8$—, or a group formed by combining these groups. Examples of the group formed by combining these groups include —(CH$_2$)$_n$—, —(CH$_2$)$_n$—O—, —(CH$_2$—O—)$_n$—, —(CH$_2$CH$_2$—O—)$_m$, —O—(CH$_2$)$_n$—, —O—(CH$_2$)$_n$—O—, —O—(CH$_2$—O—)$_n$—, —O—(CH$_2$CH$_2$—O—)$_m$, —C(=O)—O—(CH$_2$)$_n$—, —C(=O)—O—(CH$_2$)$_n$—O—, —C(=O)—O—(CH$_2$—O—)$_n$—, —C(=O)—O—(CH$_2$CH$_2$—O—)$_m$, —C(=O)—NR$^8$—(CH$_2$)$_n$—, —C(=O)—NR$^8$—(CH$_2$)$_n$—O—, —C(=O)—NR$^8$—(CH$_2$—O—)$_n$—, —C(=O)—NR$^8$—(CH$_2$CH$_2$—O—)$_m$, and —(CH$_2$)$_n$—O—C(=O)—(CH$_2$)$_n$—O—. Here, n represents an integer of 2 to 12, m represents an integer of 2 to 6, and R$^8$ represents a hydrogen atom or an alkyl group having 1 to 6 carbon atoms. In a case where n is 3, the alkylene group represented by —$(CH_2)_n$— may be branched.

$P_3$ represents a polymerizable group. The definition of the polymerizable group is as described above.

The method of forming the positive A-plate is not particularly limited and known methods may be used.

Among these, from the viewpoint of easy control of in-plane retardation, a method of applying a positive A-plate forming composition (hereinafter, also simply referred to as "composition") including a liquid crystal compound having a polymerizable group (hereinafter, also simply referred to as "polymerizable liquid crystal compound") to form a coating film, subjecting the coating film to an alignment treatment to align the polymerizable liquid crystal compound, and subjecting the obtained coating film to a curing treatment (ultraviolet irradiation (photoirradiation treatment) or heating treatment) to obtain a positive A-plate is preferable.

Hereinafter, the procedures of the method will be described in detail.

First, a composition is applied to a support to form a coating film, and the coating film is subjected to an alignment treatment to align a polymerizable liquid crystal compound.

The composition used includes a polymerizable liquid crystal compound. The definition of the polymerizable liquid crystal compound is as described above.

Although the content of the polymerizable liquid crystal compound in the composition is not particularly limited, from the viewpoint of easy control of in-plane retardation, the content of the polymerizable liquid crystal compound is preferably 50% by mass or more, more preferably 70% by mass or more, and even more preferably 90% by mass or more with respect to the total solid content of the composition. The upper limit is not particularly limited and is 99% by mass or less in many cases.

The total solid content of the composition does not include a solvent.

The composition may include components other than the above-described polymerizable liquid crystal compound.

For example, the composition may include a polymerization initiator. A polymerization initiator to be used is selected according to the kind of polymerization reaction and examples thereof include a thermal polymerization initiator and a photopolymerization initiator. Examples of the photopolymerization initiator include α-carbonyl compounds, acyloin ethers, α-hydrocarbon-substituted aromatic acyloin compounds, polynuclear quinone compounds, and a combination of triarylimidazole dimer and p-aminophenyl ketone.

The content of the polymerization initiator in the composition is preferably 0.01% a to 20% by mass and more preferably 0.5% to 5% by mass with respect to the total solid content of the composition.

In addition, the composition may contain a polymerizable monomer.

The polymerizable monomer may be, for example, a radically polymerizable or cationically polymerizable compound. The polymerizable monomer is preferably a polyfunctional radically polymerizable monomer and is more preferably a polymerizable monomer which is copolymerized with the liquid crystal compound having the above-mentioned polymerizable group. Examples of the polymerizable monomer include those described in paragraphs [0018] to [0020] of JP2002-296423A.

The content of the polymerizable monomer in the composition is preferably 1% to 50% by mass and more preferably 2% to 30% by mass with respect to the total mass of the polymerizable liquid crystal compound.

Further, the composition may include a surfactant.

Examples of the surfactant include conventionally known compounds, and a fluorine-based compound is preferable. Specific examples of the surfactant include the compounds described in paragraphs [0028] to [0056] of JP2001-330725A and the compounds described in paragraphs [0069] to [0126] of JP2003-295212.

Further, the composition may include a solvent. An organic solvent is preferably used as the solvent. Examples of the organic solvent include an amide (for example, N,N-dimethylformamide), a sulfoxide (for example, dimethyl sulfoxide), a heterocyclic compound (for example, pyridine), a hydrocarbon (for example, benzene or hexane), an alkyl halide (for example, chloroform or dichloromethane), an ester (for example, methyl acetate, ethyl acetate, or butyl acetate), a ketone (for example, acetone or methyl ethyl ketone), and an ether (for example, tetrahydrofuran or 1,2-dimethoxyethane). Two or more kinds of organic solvents may be used in combination.

Further, the composition may contain various alignment controlling agents such as a vertical alignment agent and a horizontal alignment agent. These alignment controlling agents are compounds capable of controlling the alignment of the liquid crystal compound horizontally or vertically on the interface side.

Further, the composition may include other additives such as an adhesion improver, a plasticizer, a polymer or the like in addition to the above-mentioned components.

The support used is a member having a function as a base material for applying the composition. The support may be a temporary support which is peeled off after the composition is applied and cured.

As the support (temporary support), in addition to a plastic film, a glass substrate or the like may be used. Examples of materials constituting the plastic film include polyesters such as polyethylene terephthalate (PET), polycarbonates, acrylic resins, epoxy resins, polyurethanes, polyamides, polyolefins, cellulose derivatives, silicone, and polyvinyl alcohol (PVA).

The thickness of the support may be about 5 to 1000 μm and is preferably 10 to 250 μm and more preferably 15 to 90 μm.

If necessary, an alignment layer may be arranged on the support.

The alignment layer generally contains a polymer as a main component. Polymers for alignment layers are described in many documents, and many commercial products are available. The polymer to be used is preferably polyvinyl alcohol, polyimide, or a derivative thereof.

The alignment layer is preferably subjected to a known rubbing treatment.

The thickness of the alignment layer is preferably 0.01 to 10 μm and more preferably 0.01 to 1 μm.

Examples of the method for applying the composition include known methods such as a curtain coating method, a dip coating method, a spin coating method, a printing coating method, a spray coating method, a slot coating method, a roll coating method, a slide coating method, a blade coating method, a gravure coating method, and a wire bar method. In the case of performing application using any of the coating methods, single layer coating is preferable.

The coating film formed on the support is subjected to an alignment treatment to align the polymerizable liquid crystal compound in the coating film.

The alignment treatment can be performed by drying the coating film at room temperature or by heating the coating film. In the case of a thermotropic liquid crystal compound, generally, the phase state in the coating film can be transferred to a liquid crystal phase by changing temperature or pressure. In the case of a liquid crystal compound having lyotropic properties, the phase state in the coating film can be transferred to a liquid crystal phase according to the compositional ratio such as the amount of a solvent.

The conditions of the case of heating the coating film are not particularly limited. However, the heating temperature is preferably 50° C. to 150° C. and the heating time is preferably 10 seconds to 5 minutes.

Next, a curing treatment is performed on the coating film in which the polymerizable liquid crystal compound is aligned.

The method of the curing treatment performed on the coating film in which the polymerizable liquid crystal compound is aligned is not particularly limited, and examples thereof include a photoirradiation treatment and a heating treatment. Among these, from the viewpoint of production suitability, a photoirradiation treatment is preferable and an ultraviolet irradiation treatment is more preferable.

The irradiation conditions for the photoirradiation treatment are not particularly limited and the irradiation amount is preferably 50 to 1000 mJ/cm$^2$.

(First Positive C-Plate)

The first positive C-plate is a layer arranged on the polarizer in the circularly polarizing plate described later through the positive A-plate. The first positive C-plate preferably has a single structure.

The Rth(550) of the first positive C-plate, which is a retardation in the thickness direction at a wavelength of 550 nm, is −110 to −70 nm. In this range, from the viewpoint that the effect of the present invention is more excellent, the Rth(550) is preferably −100 to −70 nm and more preferably −100 to −75 nm.

The in-plane retardation of the first positive C-plate at a wavelength of 550 nm is not particularly limited and from the viewpoint that the effect of the present invention is more excellent, the in-plane retardation is preferably 0 to 10 nm.

The first positive C-plate may exhibit forward wavelength dispersibility or reverse wavelength dispersibility. However, from the viewpoint that the effect of the present invention is more excellent, it is preferable that the first positive C-plate exhibits reverse wavelength dispersibility. The forward wavelength dispersibility and reverse wavelength dispersibility are preferably exhibited in the visible light range.

The first positive C-plate exhibiting forward wavelength dispersibility means that the retardation of the first positive C-plate in the thickness direction exhibits forward wavelength dispersibility. That is, this means that as the measurement wavelength increases, the retardation of the first positive C-plate in the thickness direction decreases.

In addition, the first positive C-plate exhibiting reverse wavelength dispersibility means that the retardation of the first positive C-plate in the thickness direction exhibits reverse wavelength dispersibility. That is, this means that as the measurement wavelength increases, the retardation of the first positive C-plate in the thickness direction increases.

In order to set the retardation of the first positive C-plate in the thickness direction to appropriately exhibit reverse wavelength dispersibility, specifically, the Rth.(450)/Rth(550) of the first positive C-plate is preferably 0.70 or more and less than 1.00 and more preferably 0.80 to 0.90, and the Rth(650)/Rth(550) of the first positive C-plate is preferably more than 1.00 and 1.20 or less and more preferably 1.02 to 1.10.

The Rth(450) and the Rth(650) represent retardations of the first positive C-plate in the thickness direction measured at wavelengths of 450 nm and 650 nm, respectively.

The thickness of the first positive. C-plate is not particularly limited and is adjusted such that the retardation in the thickness direction is in a predetermined range. From the viewpoint of reducing the thickness of the phase difference film, the thickness is preferably 6.0 µm or less, more preferably 0.5 to 5.0 µm, and even more preferably 1 to 2.5 µm.

In the present specification, the thickness of the first positive C-plate means the average thickness of the first positive C-plate. The thickness is obtained by measuring the thickness at 5 or more random points in the first positive C-plate and arithmetically averaging those values.

The material constituting the first positive C-plate is not particularly limited as long as the above characteristics are exhibited, and the aspects described in the positive A-plate may be used. Among these, from the viewpoint of easily controlling the above characteristics, the first positive C-plate is preferably a layer formed by fixing a liquid crystal compound (rod-like liquid crystal compound or disk-like liquid crystal compound) having a polymerizable group through polymerization or the like. In this case, after the layer is formed, the liquid crystal compound does not need to exhibit liquid crystallinity any longer.

The method of forming the first positive C-plate is not particularly limited and known methods can be adopted. For example, the above-mentioned method of forming the positive A-plate may be used.

(λ/4 Plate)

The λ/4 plate is a layer arranged between the first positive C-plate and the second positive C-plate described later in the circularly polarizing plate described later. The λ/4 plate 16 preferably has a single layer structure.

The λ/4 plate (a plate having a λ/4 function) is a plate having a function of converting linearly polarized light having a specific wavelength into circularly polarized light (or circularly polarized light into linearly polarized light). More specifically, the λ/4 plate is a plate of which the in-plane retardation at a predetermined wavelength of λ nm is λ/4 (or odd times thereof).

In the relationship, from the viewpoint that the effect of the present invention is more excellent, the in-plane retardation Re(550) at a wavelength of 550 nm is preferably 100 to 200 nm, more preferably 120 to 160 nm, and even more preferably 130 to 150 nm.

From the viewpoint that the effect of the present invention is more excellent, the Rth(550) of the λ/4 plate, which is a retardation in the thickness direction at a wavelength of 550 nm, is preferably 50 to 100 nm, more preferably 60 to 80 nm, and even more preferably 65 to 75 nm.

The λ/4 plate may exhibit forward wavelength dispersibility or reverse wavelength dispersibility. However, from the viewpoint that the effect of the present invention is more excellent, it is preferable that the λ/4 plate exhibits reverse wavelength dispersibility. The forward wavelength dispersibility and the reverse wavelength dispersibility are preferably exhibited in the visible light range.

The λ/4 plate exhibiting forward wavelength dispersibility means that the in-plane retardation of the λ/4 plate exhibits forward wavelength dispersibility. That is, this means as the measurement wavelength increases, the in-plane retardation of the λ/4 plate decreases.

In addition, the λ/4 plate exhibiting reverse wavelength dispersibility means that the in-plane retardation of the λ/4 plate exhibits reverse wavelength dispersibility. That is, this means that as the measurement wavelength increases, the in-plane retardation of the λ/4 plate increases.

In order to set the in-plane retardation of the λ/4 plate to appropriately exhibit reverse wavelength dispersibility, specifically, the Re(450)/Re(550) of the λ/4 plate is preferably 0.70 or more and less than 1.00 and more preferably 0.80 to 0.90, and the Re(650)/Re(550) of the λ/4 plate is preferably more than 1.00 and 1.20 or less and more preferably 1.02 to 1.10.

The Re(450) and the Re(650) represent in-plane retardations of the λ/4 plate measured at wavelengths of 450 nm and 650 nm, respectively.

The thickness of the λ/4 plate is not particularly limited and is adjusted such that the retardation in the thickness direction is in a predetermined range. From the viewpoint of reducing the thickness of the phase difference film, the thickness is preferably 6.0 μm or less, more preferably 0.5 to 5.0 μm, and even more preferably 0.5 to 2.5 μm.

In the present specification, the thickness of the λ/4 plate means the average thickness of the λ/4 plate. The average thickness is obtained by measuring the thickness at 5 or more random points in the λ/4 plate and arithmetically averaging those values.

As shown in FIG. 2, an angle θ formed between the in-plane slow axis of the positive A-plate 12 and the in-plane slow axis of the λ/4 plate 16A is not particularly limited, but from the viewpoint that the effect of the present invention is more excellent, the angle θ is preferably in a range of 45°±10°. In other words, the angle θ is preferably in a range of 35° to 55°. In this range, from the viewpoint that the effect of the present invention is more excellent, the angle θ is more preferably 40° to 50° and even more preferably 42° to 48°.

The angle θ means the angle formed between the in-plane slow axis of the positive A-plate 12 and the in-plane slow axis of the λ/4 plate 16A in the case of being viewed in the normal direction of the surface of the positive A-plate 12.

The material constituting the λ/4 plate is not particularly limited as long as the above characteristics are exhibited, and the aspects described in the above-mentioned positive A-plate may be used. Among these, from the viewpoint of easily controlling the above characteristics, the λ/4 plate is preferably a layer formed by fixing a liquid crystal compound (rod-like liquid crystal compound or disk-like liquid crystal compound) having a polymerizable group through polymerization or the like. In this case, after the layer is formed, the liquid crystal compound does not need to exhibit liquid crystallinity any longer.

The method of forming the λ/4 plate is not particularly limited and known methods can be adopted. For example, the above-mentioned method of forming the positive A-plate may be used.

(Second Positive C-Plate)

The second positive C-plate is a layer arranged on the surface of the λ/4 plate opposite to the polarizer in the circularly polarizing plate described later. In other words, the second positive C-plate is a layer arranged on the surface of the λ/4 plate opposite to the first positive C-plate side. The second positive C-plate preferably has a single layer structure.

The Rth(550) of the second positive C-plate, which is a retardation in the thickness direction at a wavelength of 550 nm, is −100 to −50 nm. In this range, from the viewpoint that the effect of the present invention is more excellent, the Rth(550) is preferably −90 to −60 nm and more preferably −80 to −60 nm.

The in-plane retardation of the second positive C-plate at a wavelength of 550 nm not particularly limited, but from the viewpoint that the effect of the present invention is more excellent, the in-plane retardation is preferably 0 to 10 nm.

The second positive C-plate may exhibit forward wavelength dispersibility or reverse wavelength dispersibility. However, from the viewpoint that the effect of the present invention is more excellent, it is preferable that the second positive C-plate exhibits reverse wavelength dispersibility. The forward wavelength dispersibility and reverse wavelength dispersibility are preferably exhibited in the visible light range.

The second positive C-plate exhibiting forward wavelength dispersibility means that the retardation of the second positive C-plate in the thickness direction exhibits forward wavelength dispersibility. That is, this means that as the measurement wavelength increases, the retardation of the second positive C-plate in the thickness direction decreases.

In addition, the second positive C-plate exhibiting reverse wavelength dispersibility means that the retardation of the second positive C-plate in the thickness direction exhibits reverse wavelength dispersibility That is, this means that as the measurement wavelength increases, the retardation of the second positive C-plate increases.

In order to set the retardation of the second positive C-plate in the thickness direction to appropriately exhibit reverse wavelength dispersibility, specifically, the Rth(450)/Rth(550) of the second positive C-plate is preferably 0.70 or more and less than 1.00 and more preferably 0.80 to 0.90, and the Rth(650)/Rth(550) of the second positive C-plate is preferably more than 1.00 and 1.20 or less and more preferably 1.02 to 1.10.

The Rth(450) and the Rth(650) represent retardations of the second positive C-plate in the thickness direction measured at wavelengths of 450 nm and 650 nm, respectively.

The thickness of the second positive C-plate is not particularly limited and is adjusted such that the retardation in the thickness direction is in a predetermined range. From the viewpoint of reducing the thickness of the phase difference film, the thickness is preferably 6.0 μm or less, more preferably 0.5 to 5.0 μm, and even more preferably 0.5 to 2.0 μm.

In the present specification, the thickness of the second positive C-plate means the average thickness of the second positive C-plate. The thickness is obtained by measuring the thickness at 5 or more random points in the second positive C-plate and arithmetically averaging those values.

The material constituting the second positive C-plate is not particularly limited as long as the above characteristics are exhibited, and the aspects described in the above-mentioned positive A-plate may be used. Among these, from the viewpoint of easily controlling the above characteristics, the second positive C-plate is preferably a layer formed by fixing a liquid crystal compound (rod-like liquid crystal compound or disk-like liquid crystal compound) having a polymerizable group through polymerization or the like. In this case, after the layer is formed, the liquid crystal compound does not need to exhibit liquid crystallinity any longer.

The method of forming the second positive C-plate is not particularly limited and known methods can be adopted. For example, the above-mentioned method of forming the positive A-plate may be used.

It is preferable that at least one of the positive A-plate, the first positive C-plate, the λ/4 plate, or the second positive C-plate exhibits reverse wavelength dispersibility, and it is more preferable that all of the positive A-plate, the first positive C-plate, the λ/4 plate, and the second positive C-plate exhibit reverse wavelength dispersibility.

(Other Layers)

The phase difference film may include layers other than the positive A-plate, the first positive C-plate, the λ/4 plate, and the second positive C-plate within a range not impairing the effect of the present invention.

For example, the phase difference film may include an alignment layer having a function of defining the alignment direction of the liquid crystal compound. The position where the alignment layer is arranged is not particularly limited and for example, the alignment layer may be arranged between the positive A-plate and the first positive C-plate, between the first positive C-plate and the λ/4 plate, and between the λ/4 plate and the second positive C-plate.

The material constituting the alignment layer and the thickness of the alignment layer are as described above.

In addition, the phase difference film may include an adhesive layer or a pressure sensitive adhesive layer for bonding the respective layers.

The method of producing the phase difference film is not particularly limited and for example, a method of laminating the positive A-plate, the first positive C-plate, the λ/4 plate, and the second positive C-plate respectively prepared through an adhesive or a pressure sensitive adhesive may be used.

The phase difference film can be applied for various applications, and particularly, can be suitably applied to antireflection application. More specifically, the circularly polarizing plate can be suitably applied to a display device such as an organic EL display device for the antireflection application.

Circularly Polarizing Plate

Figure 3:
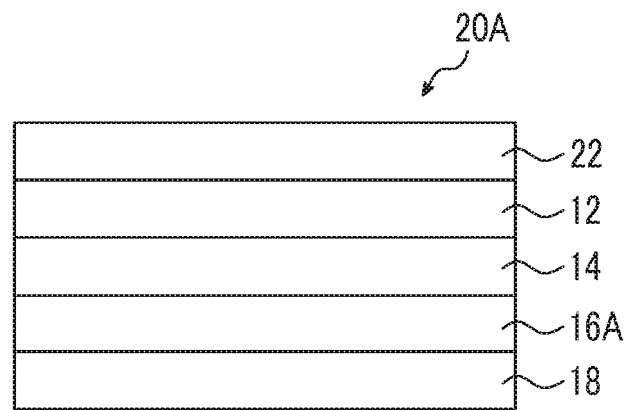
FIG. 3 is a cross-sectional view showing a first embodiment of a circularly polarizing plate according to the present invention.

A first embodiment of a circularly polarizing plate of the present invention will be described with reference to the drawings. FIG. 3 is a cross-sectional view showing a first embodiment of a circularly polarizing plate according to the present invention.

A circularly polarizing plate 20A has a polarizer 22, a positive A-plate 12, a first positive C-plate 14, a λ/4 plate 16A, and a second positive C-plate 18 in this order.

Figure 4:
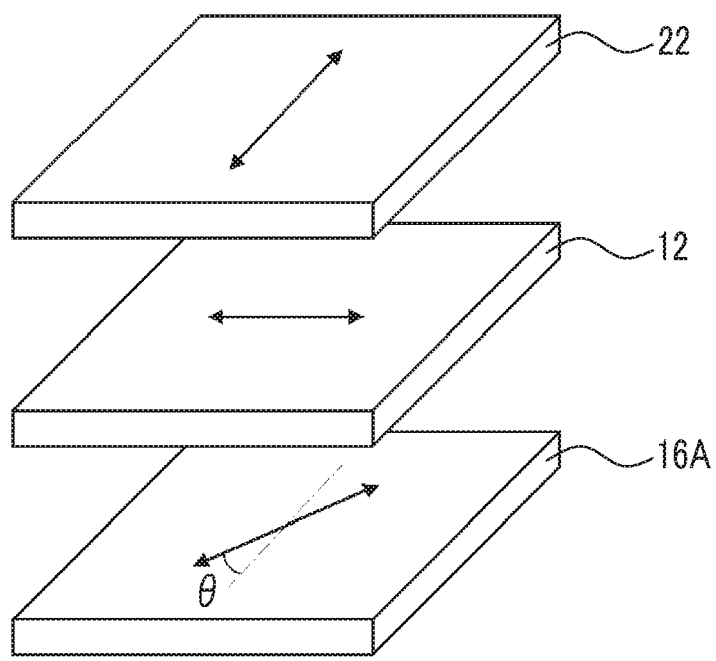
FIG. 4 is a view showing a relationship between an absorption axis of a polarizer, an in-plane slow axis of a positive A-plate, and an in-plane slow axis of a λ/4 plate in the first embodiment of the circularly polarizing plate according to the present invention.

In addition, FIG. 4 shows the relationship between the absorption axis of the polarizer 22, the in-plane slow axis of the positive A-plate 12, and the in-plane slow axis of the λ/4 plate 16A. In FIG. 4, the arrow in the polarizer 22 represents the direction of the absorption axis, and the arrows in the positive A-plate 12 and the λ/4 plate 16A represent the direction of the in-plane slow axis in the respective layers.

Hereinafter, each member included in the circularly polarizing plate 20A will be described in detail.

First, the aspects of the positive A-plate 12, the first positive C-plate 14, the λ/4 plate 16A, and the second positive C-plate 18 included in the circularly polarizing plate 20A are as described above.

(Polarizer)

The polarizer may be a member having a function of converting light into specific linearly polarized light (linear polarizer) and for example, an absorptive type polarizer may be used.

As the absorptive type polarizer, for example, an iodine-based polarizer, a dye-based polarizer using a dichroic dye, a polyene-based polarizer, and the like may be used. The iodine-based polarizer and the dye-based polarizer include a coating type polarizer and a stretching type polarizer, and any one of these polarizers can be applied. Of these polarizers, a polarizer, which is prepared by allowing polyvinyl alcohol to adsorb iodine or a dichroic dye, and performing stretching, is preferable.

In addition, examples of a method of obtaining a polarizer by performing stretching and dyeing in a state of a laminated film in which a polyvinyl alcohol layer is formed on a base material include methods disclosed in JP5048120B, JP5143918B, JP5048120B, JP4691205B, JP4751481B, and JP4751486B, and known technologies related to these polarizers can be preferably used.

Among these, from the point of handleability, the polarizer is preferably a polarizer containing a polyvinyl alcohol-based resin (a polymer including —$CH_2$—CHOH— as a repeating unit, in particular, at least one selected from the group consisting of polyvinyl alcohol and an ethylene-vinyl alcohol copolymer is preferable).

The thickness of the polarizer is not particularly limited but from the viewpoint of achieving excellent handleability and excellent optical properties, the thickness is preferably 35 µm or less, more preferably 3 to 25 µm, and even more preferably 4 to 15 µm. Within the thickness range, an image display device can be made thin.

As shown in FIG. 4, the absorption axis of the polarizer 22 and the in-plane slow axis of the positive A-plate 12 are orthogonal to each other. The definition of orthogonal is as described above, and in other words, the angle formed between the absorption axis of the polarizer 22 and the in-plane slow axis of the positive A-plate 12 is 80° to 100°. In this range, from the viewpoint that the effect of the present invention is more excellent, the angle formed between the absorption axis of the polarizer 22 and the in-plane slow axis of the positive A-plate 12 is more preferably 85° to 95° and even more preferably 87° to 93°.

The angle means an angle formed between the absorption axis of the polarizer 22 and the in-plane slow axis of the positive A-plate 12 in a case of being viewed in the normal direction of the surface of the polarizer 22.

In addition, as shown in FIG. 4, the angle θ formed between the absorption axis of the polarizer 22 and the in-plane slow axis of the λ/4 plate 16A is preferably 45°±10°. That is, the angle θ formed between the absorption axis of the polarizer 22 and the in-plane stow axis of the λ/4 plate 16A is preferably 35° to 55°. In this range, from the viewpoint that the effect of the present invention is more excellent, the angle θ formed between the absorption axis of the polarizer 22 and the in-plane slow axis of the λ/4 plate 16A is more preferably 40° to 50° and even more preferably 42° to 48°.

The angle θ means an angle formed between the absorption axis of the polarizer 22 and the in-plane slow axis of the λ/4 plate 16A in a case of being viewed in the normal direction of the surface of the polarizer 22.

(Other Layers)

The circularly polarizing plate 20A may include layers other than the polarizer 22, the positive A-plate 12, the first positive C-plate 14, the λ/4 plate 16A, and the second positive C-plate 18 within a range not impairing the effect of the present invention.

For example, the circularly polarizing plate 20A may include an alignment layer having a function of defining the alignment direction of the liquid crystal compound. The position where the alignment layer is arranged is not particularly limited.

The material constituting the alignment layer and the thickness of the alignment layer are as described above.

In addition, the circularly polarizing plate 20A may include an adhesive layer or a pressure sensitive adhesive layer for bonding the respective layers.

Further, a polarizer protective film may be arranged on the surface of the polarizer.

The configuration of the polarizer protective film is not particularly limited, and may be, for example, a transparent support or a hardcoat layer, or a laminate of a transparent support and a hardcoat layer.

A known layer can be used as a hardcoat layer and the hardcoat layer may be, for example, a layer obtained by polymerizing and curing the above-mentioned polyfunctional monomer.

Further, as a transparent support, a known transparent support can be used. For example, as the material for forming the transparent support, a cellulose polymer typified by triacetyl cellulose (hereinafter, referred to as cellulose acylate), a thermoplastic norbornene resin (ZEONEX and ZEONOR manufactured by Zeon Corporation, ARTON manufactured by JSR Corporation, or the like), an acrylic resin, or a polyester resin may be used.

The thickness of the polarizer protective film is not particularly limited and from the viewpoint of being capable of reducing the thickness of the polarizing plate, the thickness is preferably 40 µm or less and more preferably 25 µm or less.

The method of producing the circularly polarizing plate is not particularly limited and for example, a method of laminating the polarizer, the positive A-plate, the first positive C-plate, the λ/4 plate, and the second positive C-plate respectively prepared through an adhesive or a pressure sensitive adhesive may be used.

The circularly polarizing plate can be applied for various applications, and particularly, can be suitably applied to antireflection application. More specifically, the circularly polarizing plate can be suitably applied to a display device such as an organic EL display device for the antireflection application.

Organic EL Display Device

Figure 5:
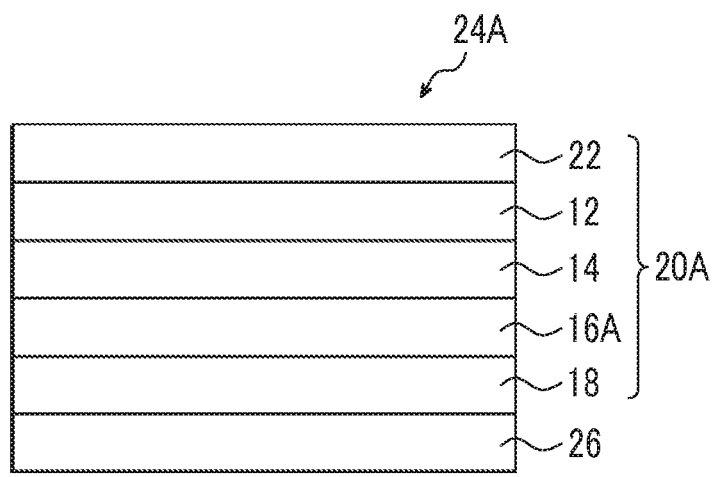
FIG. 5 is a cross-sectional view showing a first embodiment of an organic EL display device according to the present invention.

A first embodiment of an organic EL display device of the present invention will be described with reference to the drawing. FIG. 5 is a cross-sectional view showing an organic EL display device according to an embodiment of the present invention.

An organic EL display device 24A has a polarizer 22, a positive A-plate 12, a first positive C-plate 14, a λ/4 plate 16A, a second positive C-plate 18, and an organic EL display panel 26 in this order. As shown in FIG. 5, the polarizer 22 in the circularly polarizing plate 20A is arranged on the viewing side.

The organic EL display panel 26 is a display panel constituted using an organic EL element in which an organic light emitting layer (organic electroluminescent layer) is held between electrodes (between a cathode and an anode).

The configuration of the organic EL display panel 26 is not particularly limited and a known configuration is adopted.

Second Embodiment

Phase Difference Film

Figure 6:
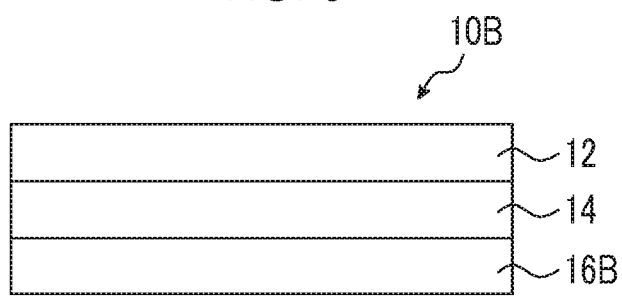
FIG. 6 is a cross-sectional view showing a second embodiment of the circularly polarizing plate according to the present invention.

A second embodiment of the phase difference film of the present invention will be described with reference to the drawings. FIG. 6 is a cross-sectional view showing a second embodiment of the phase difference film according to the present invention.

A phase difference film 10B has a positive A-plate 12, a first positive C-plate 14, and a λ/4 plate 16B in this order.

Figure 7:
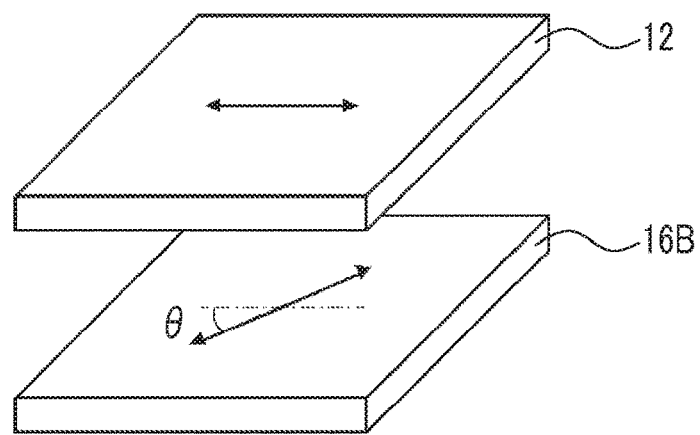
FIG. 7 is a view showing a relationship between an in-plane slow axis of a positive A-plate and an in-plane slow axis of a λ/4 plate in a second embodiment of the phase difference film according to the present invention.

In addition, FIG. 7 shows the relationship between the in-plane slow axis of the positive A-plate 12 and the in-plane slow axis of the λ/4 plate 16B. In FIG. 7, the arrows in the positive A-plate 12 and the λ/4 plate 16B represent the direction of the in-plane slow axis in the respective layers.

The phase difference film 10B shown in FIG. 6 has the same layers as in the phase difference film 10A shown in FIG. 1 except for the λ/14 plate 16B. Thus, the same constitutional elements are indicated by the same reference numerals and the description thereof is omitted. In the following, the λ/4 plate 16B will be mainly described in detail.

The phase difference film 10B may have other layers that the above-mentioned phase difference film 10A may have.

(λ/4 Plate)

The λ/4 plate is a layer arranged on the side of the first positive C-plate opposite to the positive A-plate. The λ/4 plate preferably has a single layer structure.

The λ/4 plate (a plate having a λ/4 function) is a plate having a function of converting linearly polarized light having a specific wavelength into circularly polarized light (or circularly polarized light into linearly polarized light).

The λ/4 plate in the second embodiment of the phase difference film and the λ/4 plate in the first embodiment of the phase difference film has the same characteristics except that of the λ/4 plate in the second embodiment of the phase difference film is in the range of a predetermined Nz factor.

Specifically, the ranges of the in-plane retardation, the retardation in the thickness direction, and the thickness of the λ/4 plate in the second embodiment of the phase difference film are the same as the ranges of the in-plane retardation, the retardation in the thickness direction, and the thickness of the λ/4 plate in the second embodiment of the phase difference film.

In addition, the λ/4 plate in the second embodiment of the phase difference film may exhibit forward wavelength dispersion or reverse wavelength dispersion similar to the λ/4 plate in the first embodiment of the phase difference film, but from the viewpoint that the effect of the present invention is more excellent, it is preferable that the λ/4 plate exhibits reverse wavelength dispersibility.

Further, the angle θ formed between the in-plane slow axis of the λ/4 plate 16B and the in-plane slow axis of the positive A-plate 12 in the second embodiment of the phase difference film in FIG. 7 is the same as the angle θ formed between the in-plane slow axis of the λ/4 plate 16A and the in-plane slow axis of the positive A-plate 12 in the first embodiment of the phase difference film.

The Nz factor of the λ/4 plate 0.30 to 0.70, and from the viewpoint that the effect of the present invention is more excellent, is preferably 0.40 to 0.60 and more preferably 0.45 to 0.55. The method of calculating the Nz factor is as described above.

Generally, an order parameter is known as a parameter indicating the degree of alignment of a liquid crystal compound. The order parameter is 1 in the case where there is no distribution as in a crystal state, and the order parameter is 0 in the case where there is completely random distribution as in a liquid state. For example, a nematic liquid crystal generally has a value of approximately 0.6. The order parameter, for example, is disclosed in detail in "Physical Properties of Liquid Crystal" written by DE JEU, W. H. (Kyoritsu Shuppan Co., Ltd., 1991, Page 11), and is denoted by the following expression.

$$S = \frac{3\langle \cos^2\theta \rangle - 1}{2}$$

Here, θ is an angle formed between an average alignment axis direction of an alignment element (for example, liquid crystal compound) and an axis of each alignment element.

Figure 11:
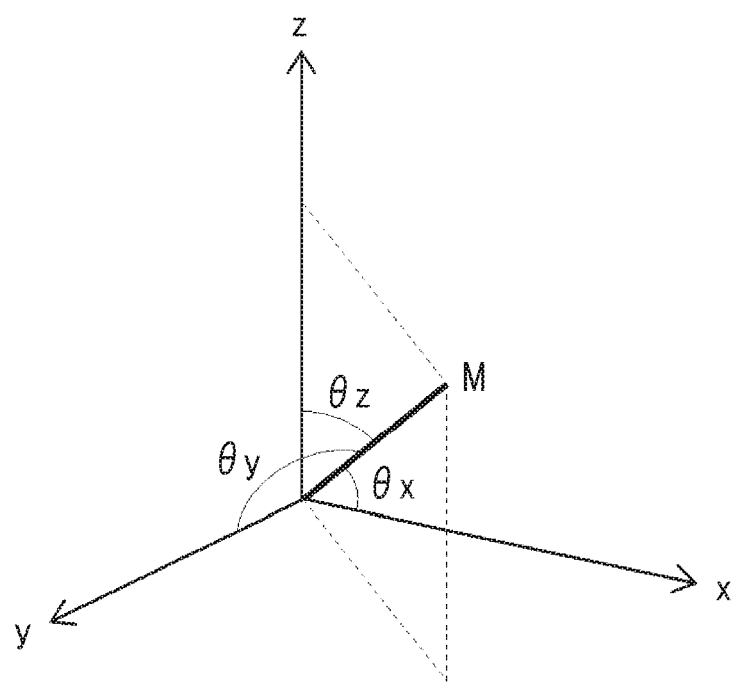
FIG. 11 is a view for illustrating the order parameter of each axial direction.

In the present specification, as shown in FIG. 11, in the case where an in-plane slow axis direction of a phase difference plate such as a λ/4 plate is set to an x axis, a direction orthogonal to the slow axis direction in the plane is set to a y axis, a thickness direction of the phase difference plate is set to a z axis, and angles between an average alignment direction M of a mesogenic group derived from the liquid crystal compound obtained by alignment analysis and the x axis, the y axis, and the z axis are set to $\theta_X$, $\theta_Y$, and $\theta_Z$, respectively, an order parameter Sx in the x direction of the mesogenic group, an order parameter Sy in the y direction thereof, and an order parameter Sz in the z direction are respectively expressed by the following expressions.

The mesogenic group is a structure included in the liquid crystal compound and is a functional group which has rigidity and alignment. The structure of the mesogenic group may be, for example, a structure in which a plurality of groups selected from the group consisting of an aromatic ring group and an alicyclic group are linked directly or via a linking group (for example, —CO—, —O—, and —NR— (R represents a hydrogen atom or an alkyl group), or a group formed by combining these groups).

$$Sx = \frac{3\langle \cos^2\theta x \rangle - 1}{2}$$

$$Sy = \frac{3\langle \cos^2\theta y \rangle - 1}{2}$$

$$Sz = \frac{3\langle \cos^2\theta z \rangle - 1}{2}$$

As the method of measuring the order parameter in each direction of the mesogenic group in the phase difference plate, polarization Raman spectrum measurement may be used.

More specifically, as the measurement device, nanofider (manufactured by Tokyo Instruments Inc.) is used in the polarization Raman spectrum measurement. First, the in-plane slow axis (x axis) direction of the phase difference plate is specified using AxoScan OPMF-1 (manufactured by Opto Science, Inc.). Next, the main surface (xy plane) of the phase difference plate, a first cross section (xz plane) of the phase difference plate, and a second cross section (yz plane) of the phase difference plate are set to measurement surfaces, and polarization Raman spectrum measurement is performed. The first cross section and the second cross section are cross sections exposed by cutting the phase difference plate in predetermined directions. The first cross section is a cross section formed by cutting the phase difference plate in a direction parallel to the x axis and perpendicular to the main surface. The second cross section is a cross section formed by cutting the phase difference plate in a direction parallel to the y axis and perpendicular to the main surface.

As a specific method of polarization Raman spectrum measurement, polarization is rotated at several angles at a predetermined excitation wavelength (for example, 785 nm), and polarization Raman spectra in directions parallel and perpendicular to the polarization are measured. Next, according to the method described in Naoki Hayashi, Tatsuhisa Kato, Phys. Rev. E, 63, 021706 (2001), a band with a peak derived from the skeleton of the mesogenic group included in the phase difference plate is subjected to fitting analysis based on the least squares method according to a theoretically derived equation, and secondary order parameters Sxy, Syx, Syz, Szy, Sxz, and Szx in the measurement plane are calculated. Further, the order parameters Sx, Sy, and Sz in the axial directions are calculated based on the following expressions.

$$Sx=(Sxy+Sxz)/2$$

$$Sy=(Syx+Syz)/2$$

$$Sz=(Szx+Szy)/2$$

The structure of the mesogenic group in the phase difference plate can be determined by thermal decomposition gas chromatography-mass spectrometry (GC-MS), infrared (IR) spectrum measurement, and nuclear magnetic resonance (NMR) measurement. In the case where the structure of a liquid crystal compound to be used is known in advance, the structure of the mesogenic group in the phase difference plate can be determined from the structure.

In addition, in the case where the structural site used for alignment analysis of a mesogenic group is parallel to the reference axis of the mesogenic group, the analysis result can be used as it is. In addition, in the case where the structural site used for the alignment analysis of the mesogenic group is orthogonal to the reference axis of the mesogenic group, the analysis result is converted to the direction of the reference axis of the mesogenic group. For example, in the case where a liquid crystal compound in which the structural site used for alignment analysis of the mesogenic group is orthogonal to the reference axis of the mesogenic group exhibits nematic liquid crystallinity, the liquid crystal compound is uniaxially aligned, and thus, by converting the measured values ($S_{X\perp}$, $S_{Y\perp}$, $S_{Z\perp}$) obtained by the above measurement according to Expressions (X) to (Z), the order parameters of the mesogenic group along each axis can be calculated.

The reference axis is an axis for calculating the order parameter, and varies depending on the kind of mesogenic group, which will be described in detail later.

$$S_X = -2S_{X\perp} \qquad \text{Expression (X)}$$

$$S_Y = -2S_{Y\perp} \qquad \text{Expression (Y)}$$

$$S_Z = -2S_{Z\perp} \qquad \text{Expression (Z)}$$

In the case where order parameters are calculated, the reference axis changes depending on the kind of mesogenic group. Specifically, in the case where the mesogenic group is a rod-like mesogenic group, order parameters are calculated based on the major axis of the mesogenic group. That is, the major axis of the mesogenic group serves as a reference axis, the angles formed between the average alignment direction of the major axis of the mesogenic group and the above-mentioned x axis, y axis, and z axis are respectively set to $\theta_X$, $\theta_Y$, and $\theta_Z$ so that order parameters are calculated.

In addition, in the case where the mesogenic group is a disk-like mesogenic group, the order parameters are calculated with reference to the axis orthogonal to the disk-like plane of the mesogenic group. That is, the axis orthogonal to the disk-like plane of the mesogenic group is the reference axis, and the angles formed between the average alignment direction of the axis orthogonal to the disk-like plane of the mesogenic group and the above-mentioned x axis, y axis, and z axis are respectively set to $\theta_X$, $\theta_Y$, and $\theta_Z$ so that order parameters are calculated.

In the λ/4 plate, in the case where the mesogenic group derived from the liquid crystal compound is a rod-like mesogenic group, it is preferable to satisfy the requirements of Expressions (A1) to (A3).

$Sx>Sz>Sy$    Expression (A1)

$-0.3<Sz<0.2$ (preferably, $-0.10<Sz<0.10$)    Expression (A2)

$Sx>0.05$    Expression (A3)

The Sx is preferably 0.1 or more and more preferably 0.2 or more. The upper limit is not particularly limited and is 0.4 or less in many cases.

In addition, Sy is preferably −0.1 or less and more preferably −0.2 or less. The lower limit is not particularly limited and is −0.4 or more in many cases.

Further, a difference between the absolute value of Sx and the absolute value of Sy is preferably 0.1 or less and more preferably 0.04 or less. The lower limit is not particularly limited and is preferably 0.

In the λ/4 plate, in the case where the mesogenic group derived from the liquid crystal compound is a disk-like mesogenic group, the requirements of Expressions (A4) to (A6) are satisfied.

$Sy>Sz>Sx$    Expression (A4)

$-0.2<Sz<0.3$ (preferably, $-0.10<Sz<0.10$)    Expression (A5)

$Sy>0.05$    Expression (A6)

The Sx is preferably −0.1 or less and more preferably −0.2 or less. The lower limit is not particularly limited and is −0.4 or more in many cases.

In addition, Sy is preferably 0.1 or more and more preferably 0.2 or more. The upper limit is not particularly limited and is 0.4 or less in many cases.

Further, a difference between the absolute value of Sx and the absolute value of Sy is preferably 0.1 or less and more preferably 0.04 or less. The lower limit is not particularly limited and is preferably 0.

The material constituting the λ/4 plate is not particularly limited as long as the above characteristics are exhibited, and the aspects described in the above-mentioned positive A-plate may be used. Among these, from the viewpoint of easily controlling the above characteristics, the λ/4 plate is preferably a layer formed by fixing a liquid crystal compound (rod-like liquid crystal compound or disk-like liquid crystal compound) having a polymerizable group through polymerization or the like. In this case, after the layer is formed, the liquid crystal compound does not need to exhibit liquid crystallinity any longer.

The method of forming the λ/4 plate is not particularly limited and known methods can be adopted. For example, the above-mentioned method of forming the positive A-plate may be used.

In the case where the λ/4 plate is produced, if necessary, a step of subjecting at least one of a stretching treatment or a shrinkage treatment to the coating film subjected to a curing treatment may be further provided.

In the step, both a stretching treatment and a shrinkage treatment may be performed, and for example, the kind of treatment may be changed according to the direction such that a stretching treatment is performed in one direction, and a shrinkage treatment is performed in the other direction.

Examples of the method of the stretching treatment include known methods of stretching treatment such as uniaxial stretching and biaxial stretching.

With respect to the shrinkage treatment (particularly, heat shrinkage treatment), methods described in, for example, JP2006-215142A, JP2007-261189A, and JP4228703B can be referred to.

As the above-mentioned support, a support (heat shrinkable support) that shrinks in a specific direction during a heating treatment at the time of stretching may also be mentioned. For example, by using such a support, the cured film can be shrunk in the shrinkage direction of the support while being stretched in a specific direction.

As a direction in which the cured film is subjected to the stretching treatment and/or the shrinkage treatment, the optimum direction is appropriately selected according to the kind of the polymerizable liquid crystal compound to be used and the alignment direction thereof.

For example, in the case where a rod-like liquid crystal compound is used as the polymerizable liquid crystal compound and the polymerizable liquid crystal compound is aligned in the direction perpendicular to the surface of the coating film, by stretching the cured film in one direction parallel to the surface (main surface) of the cured film and shrinking the cured film in a direction orthogonal to the one direction in the plane, a λ/4 plate exhibiting a predetermined Nz factor can be obtained.

Although the method of the stretching treatment and the shrinkage treatment has been described above, the present invention is not limited to the above, and the optimum treatment is appropriately performed depending on the kind of liquid crystal compound to be used.

Circularly Polarizing Plate

Figure 8:
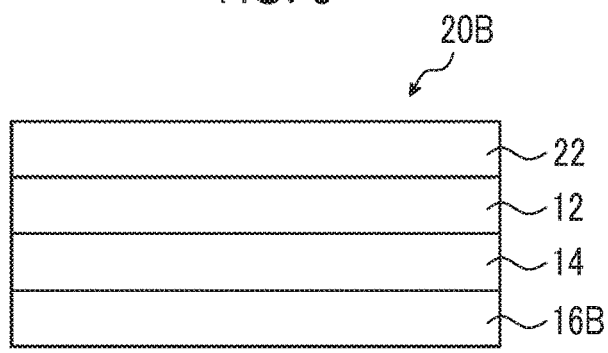
FIG. 8 is a cross-sectional view showing a second embodiment of the circularly polarizing plate according to the present invention.

Hereinafter, a second embodiment of the circularly polarizing plate according to the present invention will be described with reference to the drawings. FIG. 8 shows a cross-sectional view showing the first embodiment of the circularly polarizing plate according to the present invention.

A circularly polarizing plate 20B has a polarizer 22, a positive A-plate 12, a first positive C-plate 14, and a λ/4 plate 16B in this order.

Figure 9:
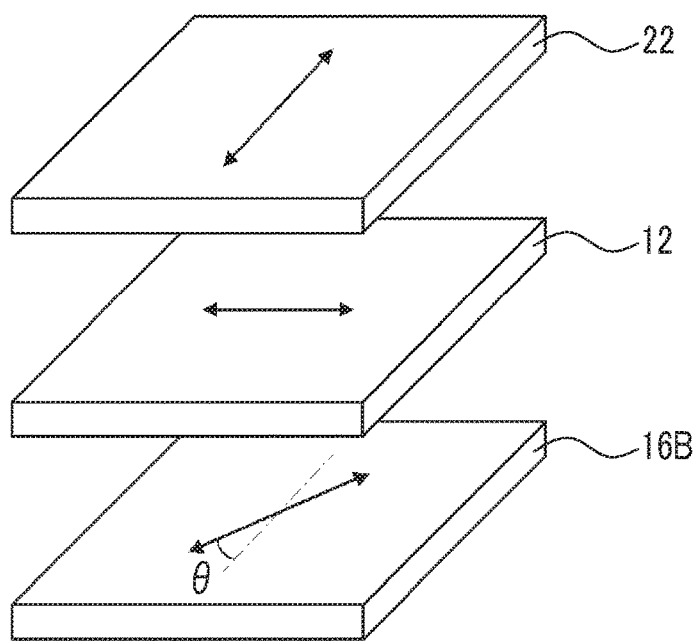
FIG. 9 is a view showing a relationship between an absorption axis of a polarizer, an in-plane slow axis of a positive A-plate, and an in-plane slow axis of a λ/4 plate in the second embodiment of the circularly polarizing plate according to the present invention.

In addition, FIG. 9 is a view showing the relationship between the absorption axis of the polarizer 22, the in-plane slow axis of the positive A-plate 12, and the in-plane slow axis of a λ/4 plate 16B. In FIG. 9, the arrow in the polarizer 22 represents the direction of the absorption axis, and the arrows in the positive A-plate 12 and the λ/4 plate 16B represent the direction of the in-plane slow axis in the respective layers.

The circularly polarizing plate 20B shown in FIG. 8 has the same layers as in the circularly polarizing plate 20A shown in FIG. 3 except for the λ/4 plate 16B. Thus, the same constitutional elements are indicated by the same reference numerals and the description thereof is omitted. In the following, the aspect of the λ/4 plate 16B is as described above.

The angle formed between the absorption axis of the polarizer 22 and the in-plane slow axis of the positive A-plate 12 in the circularly polarizing plate 20B, and the angle θ formed between the absorption axis of the polarizer 22 and the in-plane slow axis of the λ/4 plate 16B are the same as the angle formed between the absorption axis of the polarizer 22 and the in-plane slow axis of the positive A-plate 12 in the circularly polarizing plate 20A, and the angle θ formed between the absorption axis of the polarizer 22 and the in-plane slow axis of the λ/4 plate 16A, respectively.

The method of producing the circularly polarizing plate is not particularly limited and for example, a method of laminating the polarizer, the positive A-plate, the first positive C-plate, and the λ/4 plate respectively prepared through an adhesive or a pressure sensitive adhesive may be used.

The circularly polarizing plate can be applied for various applications, and particularly, can be suitably applied to antireflection application. More specifically, the circularly polarizing plate can be suitably applied to a display device such as an organic EL display device for the antireflection application.

Organic EL Display Device

Figure 10:
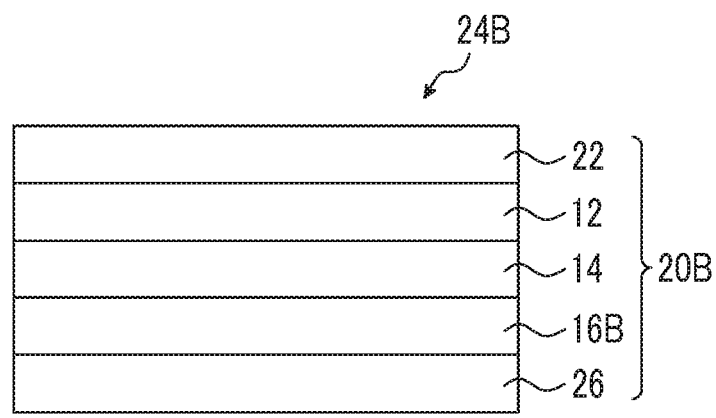
FIG. 10 is a cross-sectional view showing a second embodiment of the organic EL display device according to the present invention.

A second embodiment of the organic EL display device of the present invention will be described with reference to the drawing. FIG. 10 shows a cross-sectional view showing the organic EL display device according to the present invention.

An organic EL display device 24B has a polarizer 22, a positive A-plate 12, a first positive C-plate 14, a λ/4 plate 16B, and an organic EL display panel 26 in this order. As shown in FIG. 10, the polarizer 22 in the circularly polarizing plate 20B is arranged on the viewing side.

The organic EL display device 24B shown in FIG. 10 has the same layers as in the organic EL display device 24A shown in FIG. 5 except for the λ/4 plate 16B. Thus, the same constitutional elements are indicated by the same reference numerals and the description thereof is omitted. In addition, the aspect of the λ/4 plate 16B is as described above.

EXAMPLES

The features of the present invention will be described in more detail with reference to the following Examples. The materials, the amount of the materials used, the ratio between the materials, the content and the procedures of treatment, and the like shown in the following examples can be appropriately modified as long as the modification does not depart from the gist of the present invention. Accordingly, the scope of the present invention is not limited to the following specific examples.

Example 1

Preparation of Polarizer

Preparation of Protective Film

The following composition was put into a mixing tank and was stirred to dissolve the respective components, thereby preparing a core layer cellulose acylate dope.

| | |
|---|---|
| Cellulose acetate having an acetyl substitution degree of 2.88 | 100 parts by mass |
| Ester oligomer (Compound 1-1) | 10 parts by mass |
| Durability improver (Compound 1-2) | 4 parts by mass |
| Ultraviolet absorbing agent (Compound 1-3) | 3 parts by mass |
| Methylene chloride (first solvent) | 438 parts by mass |
| Methanol (second solvent) | 65 parts by mass |

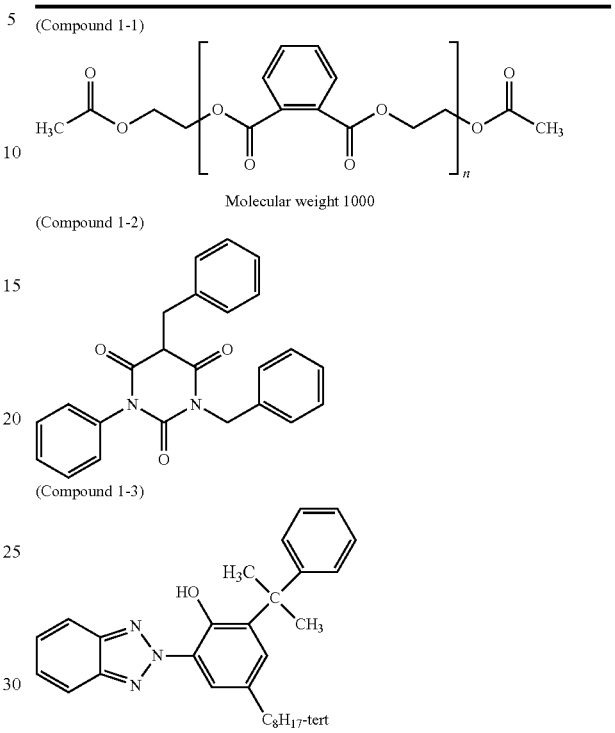

Preparation of Outer Layer Cellulose Acylate Dope 10 parts by mass of a matting agent dispersion liquid having the following composition was added to 90 parts by mass of the above-mentioned core layer cellulose acylate dope to prepare an outer layer cellulose acylate dope.

| | |
|---|---|
| Silica particles having an average particle size of 20 nm (AEROSIL R972, manufactured by Nippon Aerosil Co., Ltd.) | 2 parts by mass |
| Methylene chloride (first solvent) | 76 parts by mass |
| Methanol (second solvent) | 11 parts by mass |
| Core layer cellulose acylate dope 1 | 1 part by mass |

Preparation of Cellulose Acylate Film

Three layers of the core layer cellulose acylate dope and the outer layer cellulose acylate dope on both sides thereof were cast simultaneously onto a drum at 20° C. from a casting port. The film was peeled from the drum in a state where the solvent content of the film was approximately 20% by mass, and both ends in the width direction of the peeled film were fixed with tenter clips. Then, the film was dried while stretching the film 1.2 times in the transverse direction in a state where the residual solvent was 3% to 15% by mass. Thereafter, the stretched film was conveyed between the rolls of a heat treatment apparatus to prepare a cellulose acylate film having a thickness of 25 μm. The film was used as a polarizing plate protective film.

Preparation of Hardcoat Layer

As a hardcoat layer forming coating liquid, a curable composition for hardcoat in Table 1 below was prepared.

TABLE 1

| | Monomer | | | | UV Initiator | | |
| --- | --- | --- | --- | --- | --- | --- | --- |
| | Monomer 1 | Monomer 2 | Monomer 1/ Monomer 2 | Total amount added [parts by mass] | Kind | Amount added [parts by mass] | Solvent |
| Hardcoat 1 | Pentaerythritol triacrylate | Pentaerythritol tetraacryalte | 3/2 | 53.5 | UV initiator 1 | 1.5 | Ethyl acetate |

(Compound 2-1)

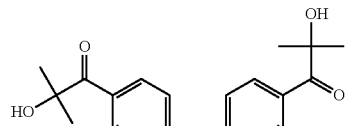

UV Initiator 1

The curable composition for hardcoat was applied onto the surface of the polarizing plate protective film prepared above. Thereafter, the coating film of the polarizing plate protective film was dried at 100° C. for 60 seconds, and the coating film was cured by irradiating the coating film with ultraviolet (UV) light at 1.5 kW and at 300 mJ under the conditions of nitrogen of 0.1% or less, thereby preparing a protective film with a hardcoat layer which has a hardcoat layer with a thickness of 3 μm. The film thickness of the hardcoat layer was adjusted by adjusting the coating amount in a die coating method using a slot die.

Preparation of Polarizer with Protective Film

1) Saponification of Film

The protective film with a hardcoat layer thus prepared was immersed in a 4.5 mol/L sodium hydroxide aqueous solution (saponification solution) whose temperature was adjusted to 37° C. for 1 minute. Thereafter, the protective film with a hardcoat layer was taken out and was washed with water. Then, the protective film with a hardcoat layer was immersed in a 0.05 mol/L sulfuric acid aqueous solution for 30 seconds, and then the protective film with a hardcoat layer was taken out and further caused to pass through a water washing bath. Then, the obtained film was dewatered repeatedly three times with an air knife to remove water, and then dried by retaining in a drying zone at 70° C. for 15 seconds, thereby preparing a saponified protective film with a hardcoat layer.

2) Preparation of Polarizer

The film was stretched in the longitudinal direction with two pairs of nip rolls having a difference in circumferential speed according to Example 1 of JP2001-141926A under changed drying conditions, thereby preparing a polarizer having a width of 1330 mm and a thickness of 15 μm.

3) Lamination

The prepared polarizer and the saponified protective film with a hardcoat layer were laminated by a roll-to-roll process using a 3 mass % aqueous solution of PVA (PVA-117H, manufactured by Kuraray Co., Ltd.) as an adhesive in such a manner that the absorption axis of the polarizer and the longitudinal direction of the film were arranged to be parallel to each other (protective film with a hardcoat layer), and thus a polarizer with a protective film was prepared.

At this time, the polarizer and the protective film with a hardcoat layer subjected to the saponification treatment were laminated such that the cellulose acylate film faced the polarizer.

Preparation of Positive A-Plate

Preparation of Temporary Support

A pellet of a mixture (Tg 127° C.) of 90 parts by mass of an acrylic resin having a lactone ring structure represented by Formula (II) {copolymerization monomer mass ratio=methyl methacrylate/methyl 2-(hydroxymethyl) acrylate=8/2, lactone cyclization ratio: about 100%, content ratio of the lactone ring structure: 19.4%, weight-average molecular weight: 133,000, melt flow rate: 6.5 g/10 min (240° C., 10 kgf), Tg 131° C.}, and 10 parts by mass of acrylonitrile-styrene (AS) resin {Toyo AS AS20, manufactured by Toyo-Styrene Co., Ltd.}; was supplied to a twin-screw extruder and melt-extruded in a sheet form at about 280° C. Thereafter, the melt-extruded sheet was longitudinally stretched in a longitudinal uniaxial stretching machine at an aeration temperature of 130° C., a sheet surface temperature of 120° C., a stretching rate of 30%/min, and a stretching ratio of 35%. Then, the longitudinally stretched sheet was transversely stretched at using a tenter type stretching machine, at an aeration temperature of 130° C., a sheet surface temperature of 120° C., a stretching rate of 30%/min, and a stretching ratio of 35%. Then, both ends of the transversely stretched sheet were cut off before the winding section and the sheet was wound up as a roll film having a length of 4000 m. Thus, a long temporary support having a thickness of 40 μm was prepared.

 (II)

In Formula (II), $R^1$ represents a hydrogen atom and $R^2$ and $R^3$ represent a methyl group.

Formation of Alignment Layer

An alignment layer forming coating liquid having the following composition was continuously applied to the temporary support using a #14 wire bar. The temporary support coated with the alignment layer forming coating liquid was dried with warm air at 60° C. for 60 seconds and further dried with warm air at 100° C. for 120 seconds, thereby forming an alignment layer on the temporary support. Further, a rubbing treatment was performed on the coating film in the longitudinal direction of the temporary support, and thus an alignment layer was formed.

The saponification degree of modified polyvinyl alcohol used was 96.8%.

—Composition of Alignment layer Forming Coating Liquid (A)—

| | |
|---|---|
| Modified polyvinyl alcohol below | 10 parts by mass |
| Water | 308 parts by mass |
| Methanol | 70 parts by mass |
| Isopropanol | 29 parts by mass |
| Photopolymerization initiator IRGACURE (registered trademark) 2959, manufactured by BASF SE) | 0.8 parts by mass |

$$-(CH_2CH)_{96.8}-(CH_2CH)_{1.5}-(CH_2CH)_{1.7}-$$

Modified polyvinyl alcohol

The compositional ratio of modified polyvinyl alcohol is described by a mole fraction.

Formation of Positive A-Plate

Next, a composition 1 shown in Table 2 described later was prepared by dissolving the composition in methyl ethyl ketone (MEK) such that the solid content concentration was 10% by mass. Thus, a coating liquid was obtained. The obtained coating liquid was applied to the alignment layer using a bar coater and heated and aged at 120° C. for 2 minutes. Thus, a homogeneous alignment state of the liquid crystal compound in the coating film was obtained. Then, the coating film was kept at 120° C. and was irradiated with ultraviolet rays at 100 mJ/cm$^2$ using a metal halide lamp at 120° C. to form a positive A-plate (film thickness: 1.6 μm). By the above-described procedure, a film A having a temporary support, an alignment layer, and a positive A-plate was obtained.

The numerical values in Table 2 represent parts by mass.

TABLE 2

| | Composition 1 | Composition 2 | Composition 3 |
|---|---|---|---|
| Rod-like liquid crystal compound (1) | 50 | 30 | |
| Rod-like liquid crystal compound (2) | 50 | 30 | |
| Rod-like liquid crystal compound (3) | | 40 | |
| Disk-like liquid crystal compound 101 | | | 50 |
| Disk-like liquid crystal compound 102 | | | 50 |
| Polymerization initiator 1 | 1.5 | 1.5 | 1.5 |
| Polymerization initiator 2 | 1.5 | 1.5 | 1.5 |
| Vertical alignment agent 1 | | 1 | |
| Vertical alignment agent 2 | | 0.5 | |
| Polymerizabie compound 1 | | 10 | |
| Polyinerizable compound 2 | 12 | | |

TABLE 2-continued

|  | Composition 1 | Composition 2 | Composition 3 |
|---|---|---|---|
| HISOLVE MTEM | 2 |  | 2 |
| NK ESTER A-200 | 1 |  | 1 |
| Surfactant 1 |  | 0.2 |  |
| Surfactant 2 |  | 0.4 |  |
| Surfactant 3 | 0.2 |  |  |
| Surfactant 4 |  |  | 0.2 |

Rod-like liquid crystal compound (1)

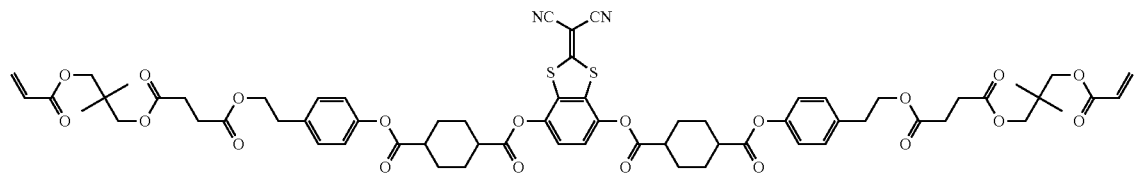

Rod-like liquid crystal compound (2)

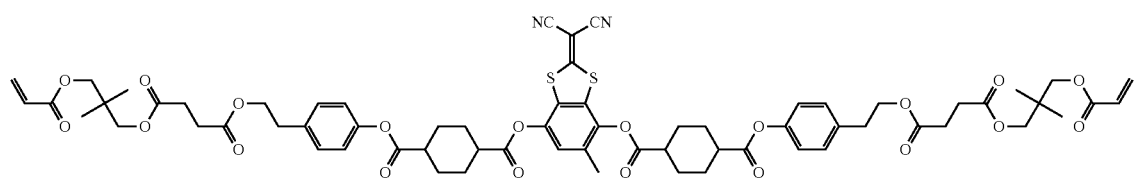

Me position isomer mixture

Rod-like liquid crystal compound (3)

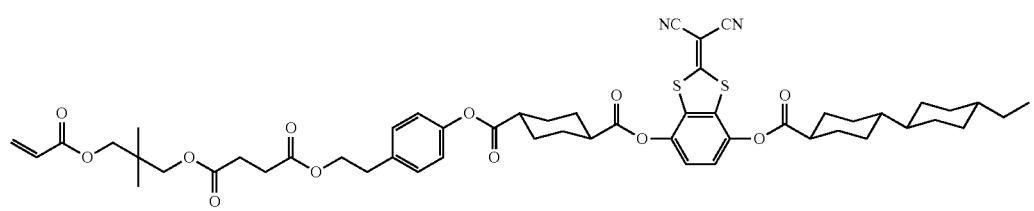

Disk-like liquid crystal compound
Compound 101

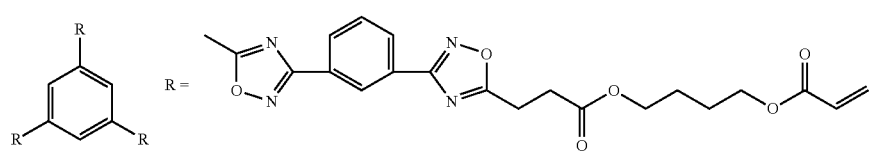

Compound 102

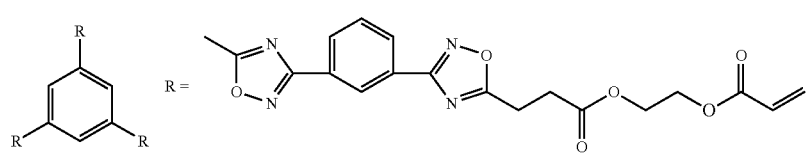

Polymerization initiator 1

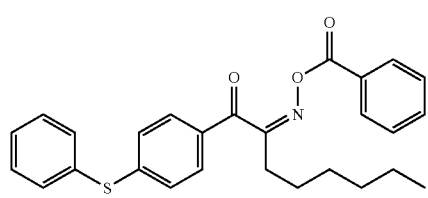

Polymerization initiator 2

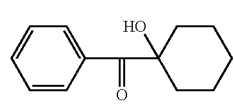

TABLE 2-continued

|  | Composition 1 | Composition 2 | Composition 3 |
| --- | --- | --- | --- |

Vertical alignment agent 1

Vertical alignment agent 2

Polymerizable compound 1

Polymerizable compound 2

Surfactant 1

Surfactant 2

Surfactant 3

Surfactant 4

Preparation of First Positive C-Plate

A temporary support with an alignment layer was produced according to the method described in <<Preparation of Positive A-Plate>>. However, a rubbing treatment was not performed in the <Formation of Alignment Layer>.

Formation of First Positive C-Plate

Next, the composition 2 shown in Table 2 described above was prepared by dissolving the composition in MEK such that the solid content concentration was 10% by mass. Thus, a coating liquid was obtained. The obtained coating liquid was applied to the alignment layer using a bar coater and heated and aged at 120° C. for 2 minutes. Thus, a homogeneous alignment state of the liquid crystal compound in the coating film was obtained. Then, the coating film was kept at 120° C. and was irradiated with ultraviolet rays at 100 mJ/cm$^2$ using a metal halide lamp at 120° C. to form a first positive C-plate (film thickness: 1.4 μm). By the above-described procedure, a film B having a temporary support, an alignment layer, and a first positive C-plate was obtained.

Preparation (A) of λ/4 Plate

A temporary support with an alignment layer was produced according to the method described in <<Preparation of Positive A-Plate>>.

Formation of λ/4 Plate

Next, the composition 1 shown in Table 2 described above was prepared by dissolving the composition in MEK such that the solid content concentration was 10% by mass, Thus, a coating liquid was obtained. The obtained coating liquid was applied to the alignment layer using a bar coater and heated and aged at 120° C. for 2 minutes. Thus, a homogeneous alignment state of the liquid crystal compound in the coating film was obtained. Then, the coating film was kept at 120° C. and was irradiated with ultraviolet rays at 100 mJ/cm$^2$ using a metal halide lamp at 120° C. to form a λ/4 plate (film thickness: 2.2 μm). By the above-described procedure, a film C having a temporary support, an alignment layer, and a λ/4 plate was obtained.

Preparation of Second Positive C-Plate

A temporary support with an alignment layer was produced according to the method described in <<Preparation of Positive A-Plate>>. However, a rubbing treatment was not performed in the <Formation of Alignment Layer>.

Formation of Second Positive C-Plate

Next, the composition 2 shown in Table 2 described above was prepare by dissolving the composition in MEK such that the solid content concentration was 10% by mass. Thus, a coating liquid was obtained. The obtained coating liquid was applied to the alignment layer using a bar coater and heated and aged at 120° C. for 2 minutes. Thus, a homogeneous alignment state of the liquid crystal compound in the coating film was obtained. Then, the coating film was kept at 120° C. and was irradiated with ultraviolet rays at 100 mJ/cm$^2$ using a metal halide lamp at 120° C. to form a second positive C-plate (film thickness: 1.1 μm). By the above-described procedure, a film D having a temporary support, an alignment layer, and a second positive C-plate was obtained.

Preparation of Circularly Polarizing Plate

The polarizer with a protective film obtained above and the film A were laminated on the surface of the polarizer with a protective film on the polarizer side through a commercially available acrylic adhesive (UV-3300 manufactured by Toagosei Co., Ltd.) such that the polarizer faced the positive A-plate, and thus a laminate was obtained. The laminate was irradiated with ultraviolet rays at an irradiation amount of 100 mJ/cm$^2$ from the temporary support side using a metal halide lamp to cure the adhesive. Then, the temporary support was peeled off from the obtained film.

The same procedure was repeated using the films B to D instead of the film A, and the first positive C-plate, the λ/4 plate, and the second positive C-plate were further laminated on the polarizer, According to the above procedure, a circularly polarizing plate having a polarizer, a positive A-plate, a first positive C-plate, a λ/4 plate, and a second positive C-plate in this order was prepared.

Each layer was laminated so as to have angles shown in "Angle (°) formed between in-plane slow axis of positive A-plate and absorption axis of polarizer", "Angle (°) formed between in-plane slow axis of positive A-plate and in-plane slow axis of λ/4 plate", and "Angle (°) formed between in-plane slow axis of λ/4 plate and absorption axis of polarizer" shown in Table 3 described later.

Examples 2 to 6, and Comparative Examples 1 to 7

Circularly polarizing plates were prepared according to the same procedure as in Example 1 except that the kind of composition and the thickness were changed as shown in Table 3 described later in the <<Preparation of Positive A-Plate>>, <<Preparation of First Positive C-Plate>>, and <<Preparation of Second Positive C-Plate>>.

The temporary support was peeled off from each of the films A to D, the Re(550), Rth(550), Re(450)/Re(550), and Re(650)/Re(550) of the positive A-plate and the λ/14 plate, and the Re(550), Rth.(550), Rth(450)/Rth(550), and Rth (650)/Rth(550) of the first positive C-plate and the second positive C-plate were measured using AxoScan.

Mounting of Circularly Polarizing Plate on Organic EL Display Panel and Evaluation of Display Performance (Mounting of Circularly Polarizing Plate on Organic EL Display Device)

GALAXY S IV manufactured by SAMSUNG Co., Ltd. equipped with an organic EL display panel was decomposed, the circularly polarizing plate was peeled off, and each of the circularly polarizing plates of Examples 1 to 6 and Comparative Examples 1 to 7 was laminated on the organic EL display panel to prepare an organic EL display device.

(Evaluation of Display Performance)

The reflectivity and reflection tint of the prepared organic EL display device were evaluated under light conditions. In a black display where external light reflected light is most easily visible, the reflected light when fluorescent light was projected from a polar angle of 45 degrees was observed. Specifically, the reflected light in the viewing angle direction (polar angle 45 degrees, azimuthal angle 0 degrees to 165 degrees in 15 degree increments) was measured with a spectroradiometer SR-3 (manufactured by Topcon Corporation) and evaluation was performed based on the following standards using Comparative Example 1 as a reference.

(Reflectivity)

A: A case where the ratio of the maximum brightness of reflected light with respect to the maximum brightness of reflected light in Comparative Example 1 is 40% or less.

B: A case where the ratio of the maximum brightness of reflected light with respect to the maximum brightness of reflected light in Comparative Example 1 is more than 40% and 60% or less.

C: A case where the ratio of the maximum brightness of reflected light with respect to the maximum brightness of reflected light n Comparative Example 1 is more than 60% and 80% or less.

D: A case where the ratio of the maximum brightness of reflected light with respect to the maximum brightness of reflected light in Comparative Example 1 is more than 80%.

(Change in Tint)

For a change in tint (change reflection tint), the magnitude $\Delta a^* b^*$ of change in tint $a^*$ and $b^*$ of reflected light at all measurement angles was defined by the following expression.

$$\Delta a^* b^* = \sqrt{(Maximum_{a^*} - Minimum_{a^*})^2 + (Maximum_{b^*} - Minimum_{b^*})^2}$$

A: A case where the ratio of a change in reflection tint ($\Delta a^* b^*$) of reflected light with respect to a change in reflection tint ($\Delta a^* b$) of reflected light in Comparative Example 1 is 40% or less.

B: A case where the ratio of a change in reflection tint ($\Delta a^* b^*$) of reflected light with respect to a change in reflection tint ($\Delta a^* b^*$) of reflected light in Comparative Example 1 is more than 40% and 60% or less.

C: A case where the ratio of a change in reflection tint ($\Delta a^* b^*$) of reflected light with respect to a change in reflection tint ($\Delta a^* b^*$) of reflected light in Comparative Example 1 is more than 60% and 80% or less.

D: A case where the ratio of a change in reflection tint ($\Delta a^* b^*$) of reflected light with respect to a change in reflection tint ($\Delta a^* b^*$) of reflected light in Comparative Example 1 is more than 80%.

TABLE 3

| | Part 1 | Example 1 | Example 2 | Example 3 | Example 4 | Example 5 | Example 6 |
|---|---|---|---|---|---|---|---|
| Positive A-plate | Re (550) (nm) | 100 | 115 | 100 | 115 | 85 | 100 |
| | Rth (550) (nm) | 50 | 58 | 50 | 58 | 43 | 50 |
| | Re (450)/Re (550) | 0.86 | 0.86 | 0.86 | 0.86 | 0.86 | 0.86 |
| | Re (650)/Re (550) | 1.03 | 1.03 | 1.03 | 1.03 | 1.03 | 1.03 |
| | Angle (°) formed between in-plane slow axis of positive A-plate and absorption axis of polarizer | 90 | 90 | 90 | 90 | 90 | 90 |
| | Kind of liquid crystal composition | Composition 1 | Composition 1 | Composition 1 | Composition 1 | Composition 1 | Composition 1 |
| | Thickness | 1.6 μm | 1.8 μm | 1.6 μm | 1.8 μm | 1.4 μm | 1.6 μm |
| First positive C-plate | Re (550) (nm) | 0 | 0 | 0 | 0 | 0 | 0 |
| | Rth (550) (nm) | −90 | −90 | −105 | −105 | −90 | −75 |
| | Rth (450)/Rth (550) | 0.86 | 0.86 | 0.86 | 0.86 | 0.86 | 0.86 |
| | Rth (650)/Rth (550) | 1.03 | 1.03 | 1.03 | 1.03 | 1.03 | 1.03 |
| | Kind of liquid crystal composition | Composition 2 | Composition 2 | Composition 2 | Composition 2 | Composition 2 | Composition 2 |
| | Thickness | 1.4 μm | 1.4 μm | 1.6 μm | 1.6 μm | 1.4 μm | 1.2 μm |
| λ/4 Plate | Re (550) (nm) | 138 | 138 | 138 | 138 | 138 | 138 |
| | Rth (550) (nm) | 69 | 69 | 69 | 69 | 69 | 69 |
| | Re (450)/Re (550) | 0.86 | 0.86 | 0.86 | 0.86 | 0.86 | 0.86 |
| | Re (650)/Re (550) | 1.03 | 1.03 | 1.03 | 1.03 | 1.03 | 1.03 |
| | Angle (°) formed between in-plane slow axis of λ/4 plate and absorption axis of polarizer | 45 | 45 | 45 | 45 | 45 | 45 |
| | Angle (°) formed between in-plane slow axis of positive A-plate and between in-plane slow axis of λ/4 plate | 45 | 45 | 45 | 45 | 45 | 45 |
| | Kind of liquid crystal composition | Composition 1 | Composition 1 | Composition 1 | Composition 1 | Composition 1 | Composition 1 |
| | Thickness | 2.2 μm | 2.2 μm | 2.2 μm | 2.2 μm | 2.2 μm | 2.2 μm |
| Second positive C-plate | Re (550) (nm) | 0 | 0 | 0 | 0 | 0 | 0 |
| | Rth (550) (nm) | −69 | −69 | −69 | −69 | −69 | −69 |
| | Rth (450)/Rth (550) | 0.86 | 0.86 | 0.86 | 0.86 | 0.86 | 0.86 |
| | Rth (650)/Rth (550) | 1.03 | 1.03 | 1.03 | 1.03 | 1.03 | 1.03 |
| | Kind of liquid crystal composition | Composition 2 | Composition 2 | Composition 2 | Composition 2 | Composition 2 | Composition 2 |
| | Thickness | 1.1 μm | 1.1 μm | 1.1 μm | 1.1 μm | 1.1 μm | 1.1 μm |
| Display performance | Reflectivity | A | B | B | C | B | A |
| | Change in tint | A | B | B | C | B | A |

TABLE 4

| Part 2 | | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|
| Positive A-plate | Re (550) (nm) | — | 130 | 100 | 70 | 100 | 105 | 270 |
| | Rth (550) (nm) | — | 65 | 50 | 35 | 50 | 53 | 135 |
| | Re (450)/Re (550) | — | 0.86 | 0.86 | 0.86 | 0.86 | 0.86 | 0.86 |
| | Re (650)/Re (550) | — | 1.03 | 1.03 | 1.03 | 1.03 | 1.03 | 1.03 |
| | Angle (°) formed between in-plane slow axis of positive A-plate and absorption axis or polarizer | — | 90 | 90 | 90 | 90 | 90 | 15 |
| | Kind of liquid crystal composition | — | Composition 1 | Composition 1 | Composition 1 | Composition 1 | Composition 1 | Composition 1 |
| | Thickness | — | 2.1 μm | 1.6 μm | 1.1 μm | 1.6 μm | 1.6 μm | 4.3 μm |
| First positive C-plate | Re (550) (nm) | — | 0 | 0 | 0 | 0 | 0 | 0 |
| | Rth (550) (nm) | — | −90 | −120 | −90 | −40 | −195 | −50 |
| | Rth (450)/Rth (550) | — | 0.86 | 0.86 | 0.86 | 0.86 | 0.86 | 0.86 |
| | Rth (650)/Rth (550) | — | 1.03 | 1.03 | 1.03 | 1.03 | 1.03 | 1.03 |
| | Kind of liquid crystal composition | — | Composition 2 | Composition 2 | Composition 2 | Composition 2 | Composition 2 | Composition 2 |
| | Thickness | — | 1.4 μm | 1.9 μm | 1.4 μm | 0.6 μm | 3.0 μm | 0.8 μm |
| λ/4 Plate | Re (550) (nm) | 138 | 138 | 138 | 138 | 138 | 138 | 138 |
| | Rth (550) (nm) | 69 | 69 | 69 | 69 | 69 | 69 | 69 |
| | Re (450)/Re (550) | 0.86 | 0.86 | 0.86 | 0.86 | 0.86 | 0.86 | 0.86 |
| | Re (650)/Re (550) | 1.03 | 1.03 | 1.03 | 1.03 | 1.03 | 1.03 | 1.03 |
| | Angle (°) formed between in-plane slow axis of λ/4 plate and absorption axis of polarizer | 45 | 45 | 45 | 45 | 45 | 45 | 60 |
| | Angle (°) formed between in-plane slow axis of positive A-plate and absorption axis of λ/4 plate | — | 45 | 45 | 45 | 45 | 45 | 45 |
| | Kind of liquid crystal composition | Composition 1 | Composition 1 | Composition 1 | Composition 1 | Composition 1 | Composition 1 | Composition 1 |
| | Thickness | 2.2 μm | 2.2 μm | 2.2 μm | 2.2 μm | 2.2 μm | 2.2 μm | 2.2 μm |
| Second positive C-plate | Re (550) (nm) | 0 | 0 | 0 | 0 | 0 | 0 | 0 |
| | Rth (550) (nm) | −69 | −69 | −69 | −69 | −69 | 280 | −110 |
| | Rth (450)/Rth (550) | 0.86 | 0.86 | 0.86 | 0.86 | 0.86 | 1.05 | 0.86 |
| | Rth (650)/Rth (550) | 1.03 | 1.03 | 1.03 | 1.03 | 1.03 | 0.98 | 1.03 |
| | Kind of liquid crystal composition | Composition 2 | Composition 2 | Composition 2 | Composition 2 | Composition 2 | Composition 3 | Composition 2 |
| | Thickness | 1.1 μm | 1.1 μm | 1.1 μm | 1.1 μm | 1.1 μm | 2.5 μm | 1.8 μm |
| Display performance | Reflectivity | D | D | D | D | D | D | D |
| | Change in tint | D | D | C | D | D | D | D |

As shown in Table 3, in the organic EL display device of the present invention, the desired effect was obtained.

Particularly, from the comparison of Examples 1, 2 and 5, it was confirmed that the effect was more excellent in the case where the Re (550) of the positive A-plate was 90 to 110 nm.

Also, from the comparison of Examples 1, 3 and 6, it was confirmed that the effect was more excellent in the case where the Rth of the first positive C-plate was −100 or more (−100 to −75 nm).

On the other hand, in Comparative Example 1 in which the positive A-plate and the first positive C-plate were not provided, Comparative Examples 2, 4 and 7 in which the Re(550) of the positive A-plate was out of the predetermined range, and Comparative Examples 3, 5 and 6 in which the Rth (550) of the first positive C-plate was out of the predetermined range, the desired effect was not obtained.

In addition, when the circularly polarizing plate described in Example 109 of WO 2013-137464 was prepared and various evaluations were performed according to the same procedure as in Example 1, the reflectivity was D and a change in tint was D for the evaluation.

Example 7

Preparation (A) of λ/4 Plate

A temporary support with an alignment layer was produced according to the method described above in <<Preparation of λ/2 Plate>> except that a rubbing treatment was not performed in the <Formation of Alignment Layer>.

Formation of Liquid Crystal Layer

Next, the formation of a liquid crystal layer in which a rod-like liquid crystal compound was vertically aligned and fixed in a nematic phase will be described.

The composition 4 shown in Table 4 described later was prepared by dissolving the composition in MEK such that the solid content concentration was 10% by mass. Thus, a coating liquid was obtained. The obtained coating liquid was applied to the alignment layer using a bar coater and heated and aged at 120° C. for 2 minutes. Thus, a homogeneous alignment state of the liquid crystal compound in the coating film was obtained. Then, the coating film was kept at 120° C. and was irradiated with ultraviolet rays at 100 mJ/cm$^2$ using a metal halide lamp at 120° C. to form a liquid crystal layer (film thickness: 8 μm).

Deformation

In a batch drawing machine in which a film including a temporary support and a liquid crystal layer prepared as described above was fixed at four sides by tenter clips, predetermined deformation is performed at an air supply temperature of 140° C., the film was deformed so as to have a predetermined deformation magnification (X direction 80% stretching, Y direction 10% shrinkage) at a film surface temperature of 130° C., and a deformation rate of 30%/min. Then, the four end portions of the obtained film were cut off and a film E including the stretched temporary support and a λ/4 plate was obtained.

Preparation of Circularly Polarizing Plate

The polarizer with a protective film obtained above and the film A were laminated on the surface of the polarizer with a protective film on the polarizer side through a commercially available acrylic adhesive (UV-3300 manufactured by Toagosei Co., Ltd.) such that the polarizer faced the film A, and thus a laminate was obtained. The laminate was irradiated with ultraviolet rays at an irradiation amount of 100 mJ/cm$^2$ from the temporary support side using a metal halide lamp to cure the adhesive. Then, the temporary support was peeled off from the obtained film.

The same procedure was repeated using the films B and E instead of the film A, and the first positive C-plate and the λ/4 plate were further laminated on the polarizer. According to the above procedure, a circularly polarizing plate having a polarizer, a positive A-plate, a first positive C-plate, and a λ/4 plate in this order was prepared.

Each layer was laminated so as to have angles shown in "Angle (°) formed between in-plane slow axis of positive A-plate and absorption axis of polarizer", "Angle (°) formed between in-plane slow axis of positive A-plate and in-plane slow axis of λ/4 plate", and "Angle (°) formed between in-plane slow axis of λ/4 plate and absorption axis of polarizer" shown in Table 5 described later.

Examples 8 to 11

Circularly polarizing plates were prepared according to the same procedure as in Example 7 except that the thickness was changed as described in Table 5 described later in the <<Preparation of Positive A-Plate>> and <<Preparation of First Positive C-Plate>>.

The above-mentioned [Mounting of Circularly Polarizing Plate on Organic EL Display Panel and Evaluation of Display Performance] was performed using the obtained circularly polarizing plates of Examples 8 to 11. The results are shown in Table 5.

The composition of the composition 4 is shown in Table 4. The numerical values in Table 4 represent parts by mass.

TABLE 5

|  | Composition 4 |
| --- | --- |
| Rod-like liquid crystal compound (3) | 70 |
| Rod-like liquid crystal compound (1) | 30 |
| Polymerization initiator 1 | 1.5 |
| Polymerization initiator 2 | 1.5 |
| Vertical alignment agent 1 | 0.5 |
| Polymerizable compound 1 | 0.5 |
| Surfactant 1 | 0.2 |
| Surfactant 2 | 0.4 |

The stretched temporary support was peeled off from the film E, and the Re(λ), Rth(λ), and the slow axis direction of the λ/4 plate were measured using AxoScan, and further, the Nz factor was calculated.

In addition, the order parameters of the mesogenic groups in the λ/4 plate used in Examples 7 to 11 were calculated according to the above-mentioned method. As a result, Sx was 0.299, Sy was −0.301, and Sz was 0.002.

TABLE 6

|  |  | Example 7 | Example 8 | Example 9 | Example 10 | Example 11 |
| --- | --- | --- | --- | --- | --- | --- |
| Positive A-plate | Re (550) (nm) | 100 | 80 | 120 | 100 | 100 |
|  | Rth (550) (nm) | 50 | 40 | 60 | 50 | 50 |
|  | Re (450)/Re (550) | 0.86 | 0.86 | 0.86 | 0.86 | 0.86 |
|  | Re (650)/Re (550) | 1.03 | 1.03 | 1.03 | 1.03 | 1.03 |
|  | Angle (°) formed between in-plane slow axis of positive A-plate and absorption axis of polarizer | 90 | 90 | 90 | 90 | 90 |
|  | Kind of liquid crystal composition | Composition 1 | Composition 1 | Composition 1 | Composition 1 | Composition 1 |
|  | Thickness | 1.6 μm | 1.3 μm | 1.9 μm | 1.6 μm | 1.6 μm |
| First positive C-plate | Re (550) (nm) | 0 | 0 | 0 | 0 | 0 |
|  | Rth (550) (nm) | −90 | −90 | −90 | −70 | −110 |
|  | Rth (450)/Rth (550) | 0.86 | 0.86 | 0.86 | 0.86 | 0.86 |
|  | Rth (650)/Rth (550) | 1.03 | 1.03 | 1.03 | 1.03 | 1.03 |
|  | Kind of liquid crystal composition | Composition 2 | Composition 2 | Composition 2 | Composition 2 | Composition 2 |
|  | Thickness | 1.4 μm | 1.4 μm | 1.4 μm | 1.1 μm | 1.7 μm |
| λ/4 Plate | Re (550) (nm) | 138 | 138 | 138 | 138 | 138 |
|  | Rth (550) (nm) | 0 | 0 | 0 | 0 | 0 |

TABLE 6-continued

|  |  | Example 7 | Example 8 | Example 9 | Example 10 | Example 11 |
|---|---|---|---|---|---|---|
|  | Nz | 0.5 | 0.5 | 0.5 | 0.5 | 0.5 |
|  | Re (450)/Re (550) | 0.85 | 0.85 | 0.85 | 0.85 | 0.85 |
|  | Re (650)/Re (550) | 1.05 | 1.05 | 1.05 | 1.05 | 1.05 |
|  | Angle (°) formed between in-plane slow axis of λ/4 plate and absorption axis of polarizer | 45 | 45 | 45 | 45 | 45 |
|  | Angle (°) formed between in-plane slow axis of positive A-plate and in-plane slow axis of λ/4 plate | 45 | 45 | 45 | 45 | 45 |
|  | Kind of liquid crystal composition | Composition 4 | Composition 4 | Composition 4 | Composition 4 | Composition 4 |
|  | Thickness | 5 μm | 5 μm | 5 μm | 5 μm | 5 μm |
| Display performance | Reflectivity | A | C | C | C | C |
|  | Change in tint | A | C | C | C | C |

As shown in Table 5, in the organic EL display device of the present invention, the desired effect was not obtained.

Particularly, from the comparison of Examples 7 to 9, it was confirmed that the effect was more excellent in the case where the Re (550) of the positive A-plate was 90 to 110 nm.

In addition, from the comparison of Examples 7, 10, and 11, it was confirmed that the effect was more excellent in the case where the Rth of the first positive C-plate was −100 to −75 nm.

EXPLANATION OF REFERENCES 10A, 10B: phase difference film
12: positive A-plate
14: first positive C-plate
16A, 16B: λ/4 plate
18: second positive C-plate
20A, 20B: circularly polarizing plate
22 polarizer
24A, 24B: organic EL display device
26: organic EL display panel

What is claimed is:

1. An organic electroluminescent display device comprising:
an organic electroluminescent display panel; and
a circularly polarizing plate arranged on the organic electroluminescent display panel,
wherein the circularly polarizing plate has a polarizer and a phase difference film,
the phase difference film has, from a polarizer side, a positive A-plate, a first positive C-plate, and a λ/4 plate,
an in-plane retardation of the positive A-plate at a wavelength of 550 nm is 80 to 120 nm,
a retardation of the first positive C-plate in a thickness direction at a wavelength of 550 nm is −110 to −70 nm,
an in-plane slow axis of the positive A-plate and an absorption axis of the polarizer are orthogonal to each other, and
an angle formed between the in-plane slow axis of the positive A-plate and an in-plane slow axis of the λ/4 plate is 45°±10°.

2. The organic electroluminescent display device according to claim 1,
wherein the phase difference film further has a second positive C-plate on a side of the λ/4 plate opposite to the first positive C-plate, and
a retardation of the second positive C-plate in a thickness direction at a wavelength of 550 nm is −100 to −50 nm.

3. The organic electroluminescent display device according to claim 1,
wherein an Nz factor of the λ/4 plate is 0.30 to 0.70.

4. The organic electroluminescent display device according to claim 1,
wherein the in-plane retardation of the positive A-plate at a wavelength of 550 nm is 90 to 110 nm.

5. The organic electroluminescent display device according to claim 1,
wherein the retardation of the first positive C-plate in the thickness direction at a wavelength of 550 nm is −100 to −75 nm.

6. The organic electroluminescent display device according to claim 1,
wherein at least one of the positive A-plate, the first positive C-plate, or the λ/4 plate exhibits reverse wavelength dispersibility.

7. The organic electroluminescent display device according to claim 1,
wherein all of the positive A-plate, the first positive C-plate, and the λ/4 plate exhibit reverse wavelength dispersibility.

8. The organic electroluminescent display device according to claim 1,
wherein all of the positive A-plate, the first positive C-plate, and the λ/4 plate are layers formed by using a liquid crystal compound.

9. A phase difference film comprising, in order:
a positive A-plate;
a first positive C-plate;
a λ/4 plate; and
a second positive C-plate,
wherein an in-plane retardation of the positive A-plate at a wavelength of 550 nm is 80 to 120 nm,
a retardation of the first positive C-plate in a thickness direction at a wavelength of 550 nm is −110 to −70 nm,
a retardation of the second positive C-plate in a thickness direction at a wavelength of 550 nm is −100 to −50 nm, and
an angle formed between an in-plane slow axis of the positive A-plate and an in-plane slow axis of the λ/4 plate is 45°±10°.

10. The phase difference film according to claim 9,
wherein the in-plane retardation of the positive A-plate at a wavelength of 550 nm is 90 to 110 nm.

11. The phase difference film according to claim 9,
wherein the retardation of the first positive C-plate in the thickness direction at a wavelength of 550 nm is −100 to −75 nm.

12. The phase difference film according to claim 9,
wherein all of the positive A-plate, the first positive C-plate, the λ/4 plate, and the second positive C-plate exhibit reverse wavelength dispersibility.

13. The phase difference film according to claim 9,
wherein all of the positive A-plate, the first positive C-plate, the λ/4 plate, and the second positive C-plate are layers formed by using a liquid crystal compound.

14. A circularly polarizing plate comprising:
a polarizer; and
the phase difference film according to claim 9 arranged on the polarizer,
wherein, from a polarizer side, the positive A-plate, the first positive C-plate, the λ/4 plate, and the second positive C-plate are arranged in this order, and
an in-plane slow axis of the positive A-plate and an absorption axis of the polarizer are orthogonal to each other.

15. A phase difference film comprising, in order:
a positive A-plate;
a first positive C-plate; and
a λ/4 plate,
wherein an in-plane retardation of the positive A-plate at a wavelength of 550 nm is 80 to 120 nm,
a retardation of the first positive C-plate in a thickness direction at a wavelength of 550 nm is −110 to −70 nm,
an Nz factor of the λ/4 plate is 0.30 to 0.70, and
an angle formed between an in-plane slow axis of the positive A-plate and an in-plane slow axis of the λ/4 plate is 45°±10°.

16. The phase difference film according to claim 15,
wherein the in-plane retardation of the positive A-plate at a wavelength of 550 nm is 90 to 110 nm.

17. The phase difference film according to claim 15,
wherein the retardation of the first positive C-plate in a thickness direction at a wavelength of 550 nm is −100 to −75 nm.

18. The phase difference film according to claim 15,
wherein all of the positive A-plate, the first positive C-plate, and the λ/4 plate exhibit reverse wavelength dispersibility.

19. The phase difference film according to claim 15,
wherein all of the positive A-plate, the first positive C-plate, and the λ/4 plate are layers formed by using a liquid crystal compound.

20. A circularly polarizing plate comprising:
a polarizer, and
the phase difference film according to claim 15 arranged on the polarizer,
wherein, from a polarizer side, the positive A-plate, the first positive C-plate, the λ/4 plate, and the second positive C-plate are arranged in this order, and
an in-plane slow axis of the positive A-plate and an absorption axis of the polarizer are orthogonal to each other.

* * * * *